US012200385B2

United States Patent
Akebono

(10) Patent No.: US 12,200,385 B2
(45) Date of Patent: Jan. 14, 2025

(54) IMAGING DEVICE AND ELECTRONIC APPARATUS

(71) Applicant: SONY SEMICONDUCTOR SOLUTIONS CORPORATION, Kanagawa (JP)

(72) Inventor: Sachio Akebono, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 38 days.

(21) Appl. No.: 18/042,240

(22) PCT Filed: Aug. 11, 2021

(86) PCT No.: PCT/JP2021/029636
§ 371 (c)(1),
(2) Date: Feb. 20, 2023

(87) PCT Pub. No.: WO2022/044809
PCT Pub. Date: Mar. 3, 2022

(65) Prior Publication Data
US 2023/0336894 A1 Oct. 19, 2023

(30) Foreign Application Priority Data

Aug. 26, 2020 (JP) ................................. 2020-143005

(51) Int. Cl.
*H04N 25/78* (2023.01)
*H03F 1/02* (2006.01)
*H03F 3/45* (2006.01)
*H03M 1/56* (2006.01)
(Continued)

(52) U.S. Cl.
CPC ........... *H04N 25/78* (2023.01); *H03F 1/0205* (2013.01); *H03F 3/45179* (2013.01);
(Continued)

(58) Field of Classification Search
CPC ......... H03F 1/0205; H03F 2203/45074; H03F 2203/45674; H03F 3/082; H03F 3/45179;
(Continued)

(56) References Cited

U.S. PATENT DOCUMENTS

2016/0316168 A1* 10/2016 Nishimura ........... H04N 25/772
2018/0109744 A1* 4/2018 Hanzawa ............. H04N 25/772
(Continued)

FOREIGN PATENT DOCUMENTS

| JP | 2012-147339 A | 8/2012 |
|---|---|---|
| WO | 2019/150917 A1 | 8/2019 |
| WO | 2020/031439 A1 | 2/2020 |

OTHER PUBLICATIONS

International Search Report and Written Opinion of PCT Application No. PCT/JP2021/029636, issued on Oct. 26, 2021, 09 pages of ISRWO.

*Primary Examiner* — Amy R Hsu
(74) *Attorney, Agent, or Firm* — CHIP LAW GROUP

(57) ABSTRACT

An imaging device according to the present disclosure includes a light-receiving pixel; a reference signal generator; a first amplification section; a second amplification section; a third amplification section; and a counter. The first amplification section is coupled to a first power supply node and a second power supply node. The first amplification section performs a comparison operation on the basis of a pixel signal and a reference signal. The first amplification section outputs a signal corresponding to a result of the comparison to a first node. The second amplification section includes a first transistor and a first load circuit. The first transistor includes a gate coupled to the first node, a drain coupled to a second node, and a source coupled to the second power supply node. The third amplification section includes a second transistor and a first switch. The second transistor includes a gate coupled to the second node, a source coupled
(Continued)

to the first power supply node, and a drain coupled to a third node. The first switch applies a predetermined voltage to the third node by being turned on. The counter is coupled to a third power supply node and a fourth power supply node. The counter stops a count operation on the basis of a voltage of the third node.

14 Claims, 18 Drawing Sheets

(51) Int. Cl.
      *H04N 25/709*     (2023.01)
      *H04N 25/76*      (2023.01)

(52) U.S. Cl.
      CPC ............ *H03M 1/56* (2013.01); *H04N 25/709* (2023.01); *H04N 25/7795* (2023.01); *H03F 2203/45074* (2013.01)

(58) Field of Classification Search
      CPC ...... H03F 3/45188; H03K 5/08; H03M 1/123; H03M 1/56; H04N 25/709; H04N 25/7795; H04N 25/78
      See application file for complete search history.

(56) References Cited

U.S. PATENT DOCUMENTS

| | | | |
|---|---|---|---|
| 2022/0150437 A1* | 5/2022 | Oosako | H04N 25/78 |
| 2023/0209227 A1* | 6/2023 | Yamashita | H04N 25/772 |
| | | | 348/308 |

* cited by examiner

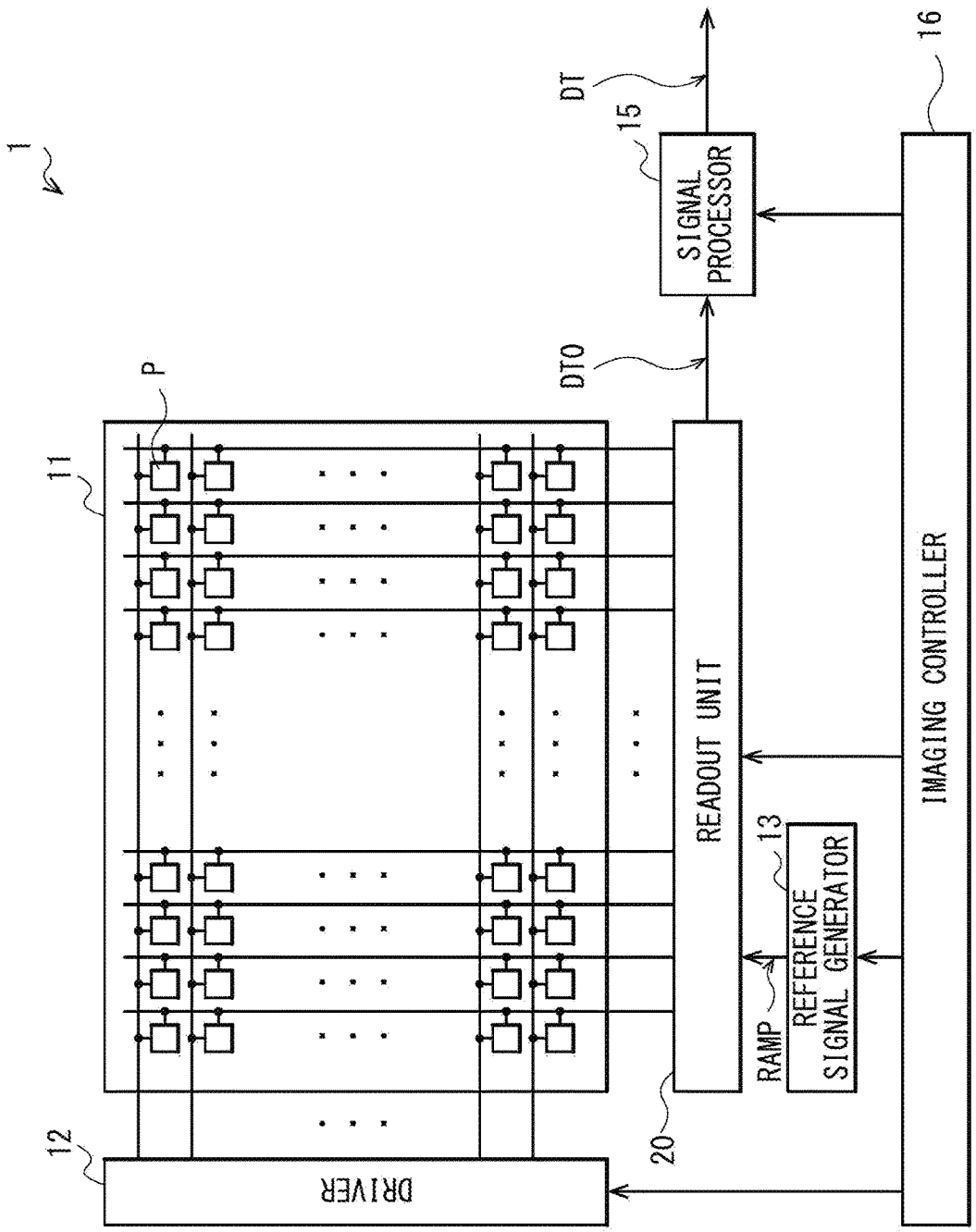
[FIG. 1]

[FIG. 2]
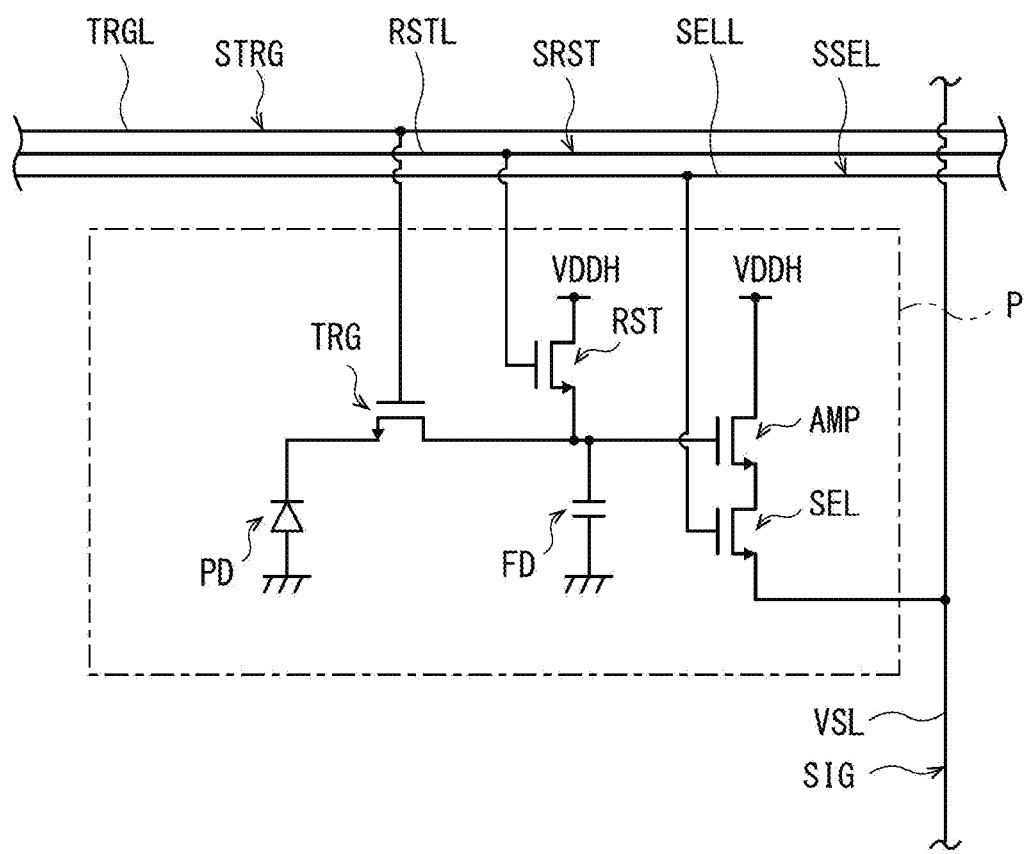

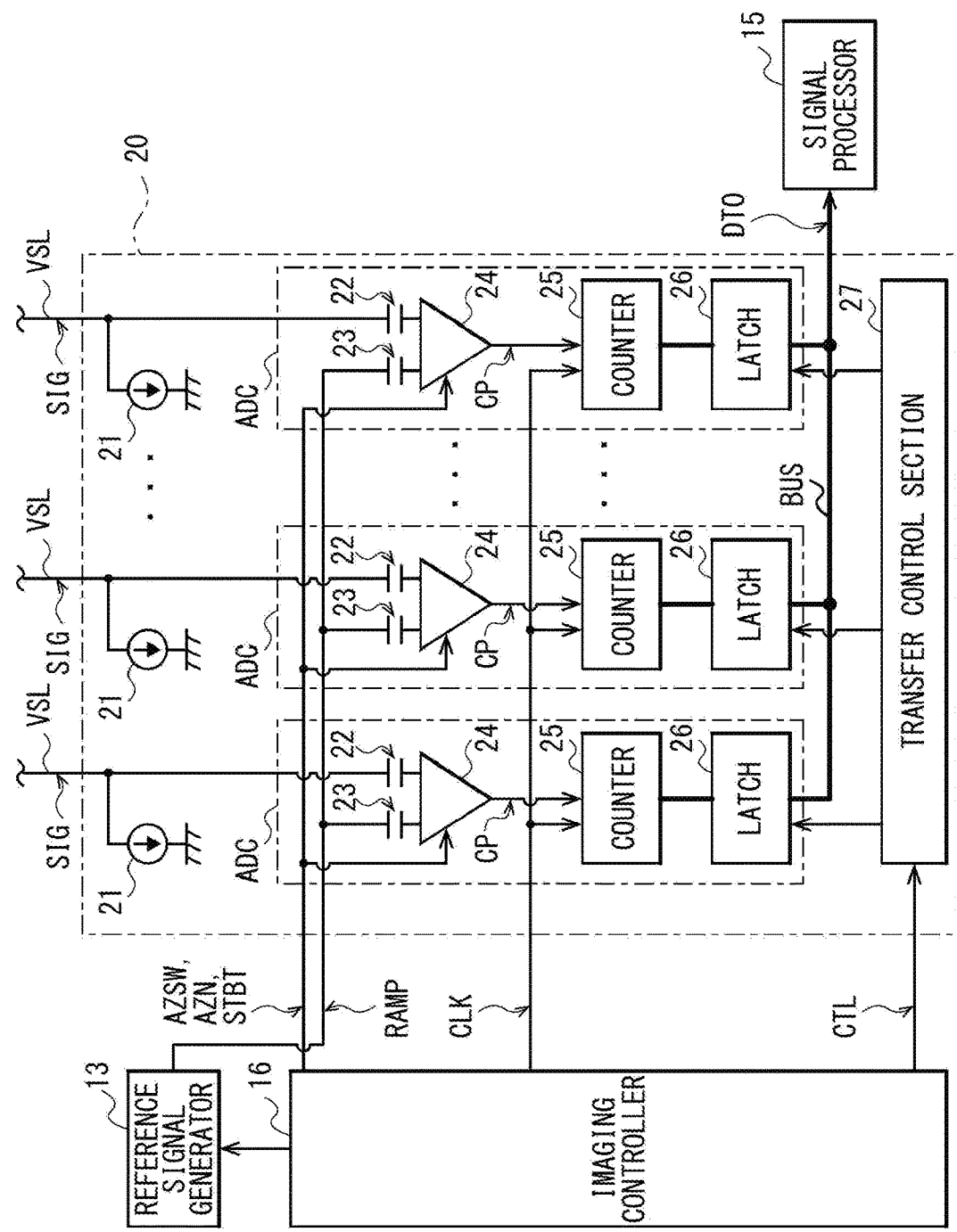
[FIG. 3]

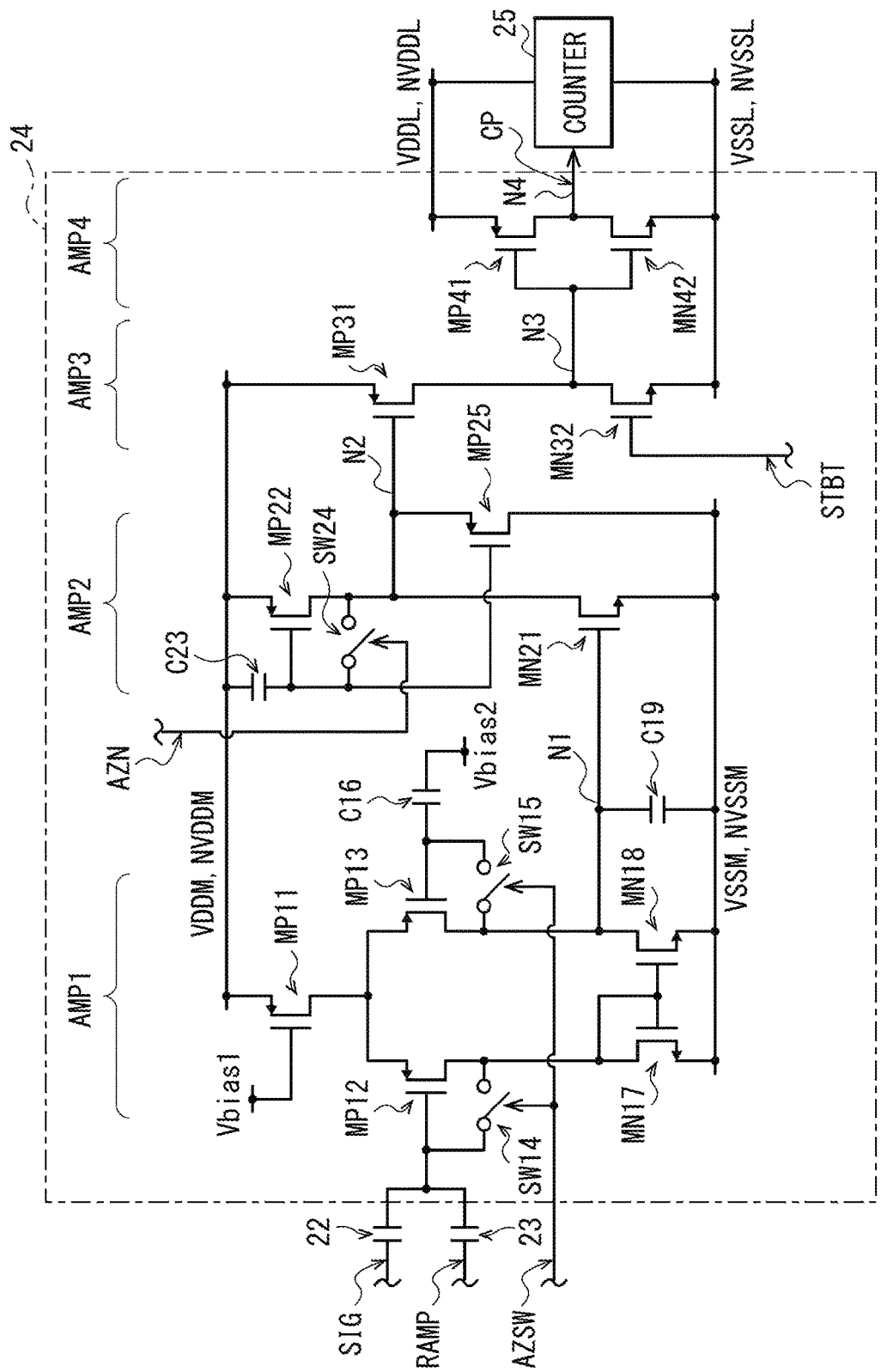
[FIG. 4]

[FIG. 5]
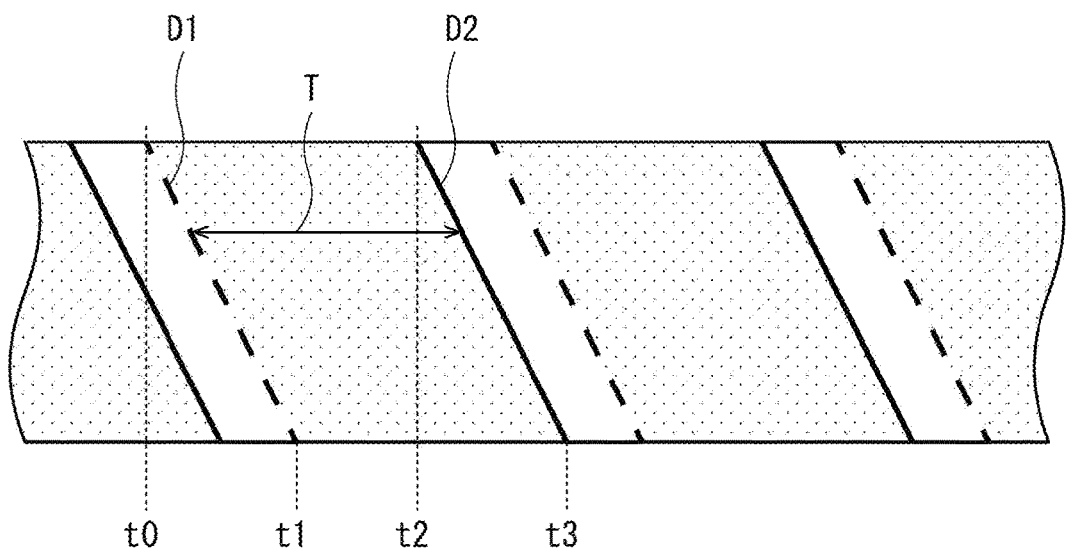

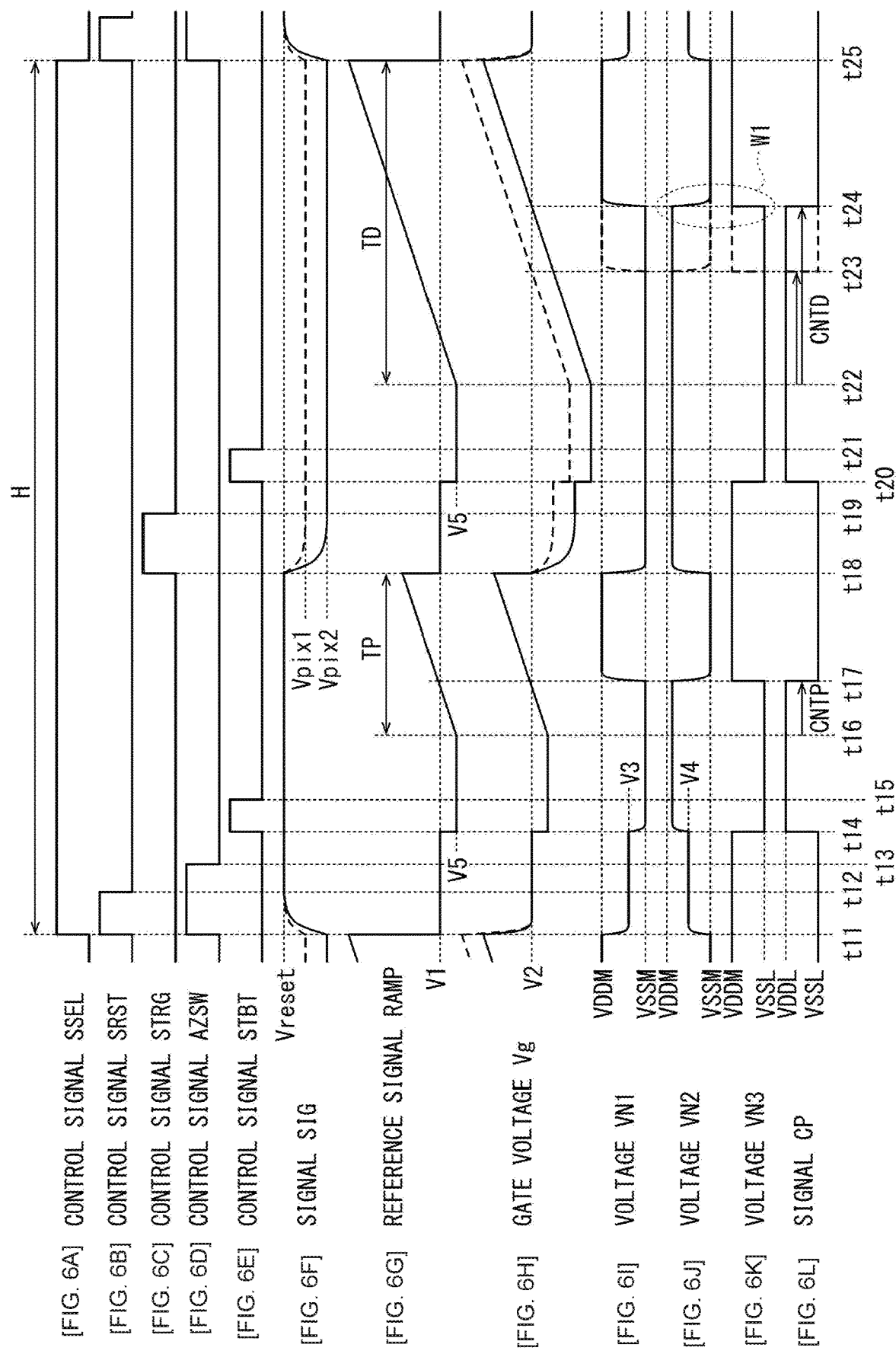

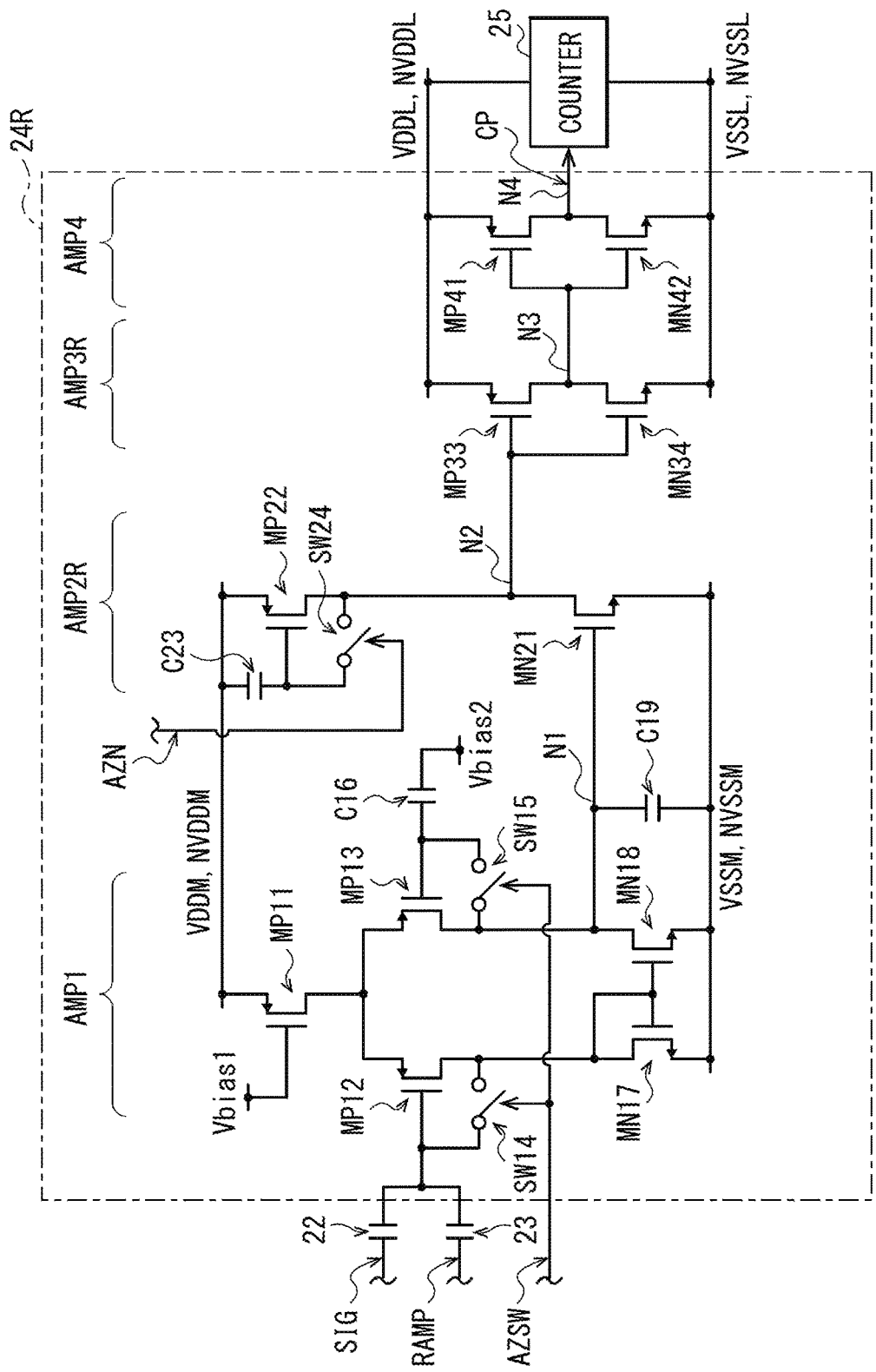
[FIG. 7]

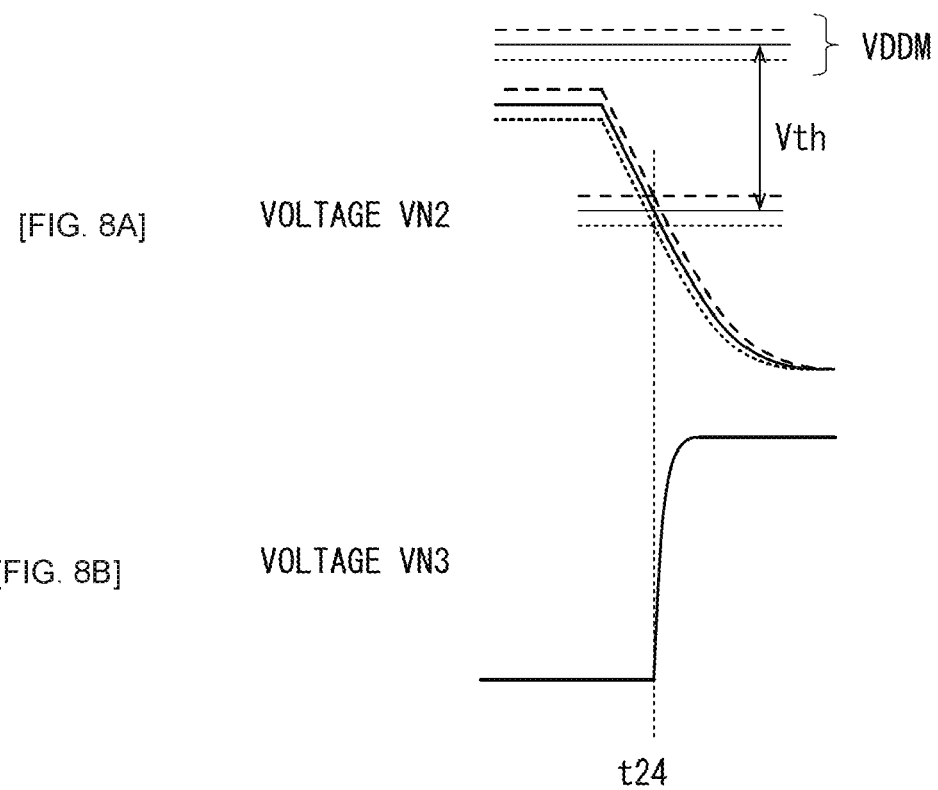

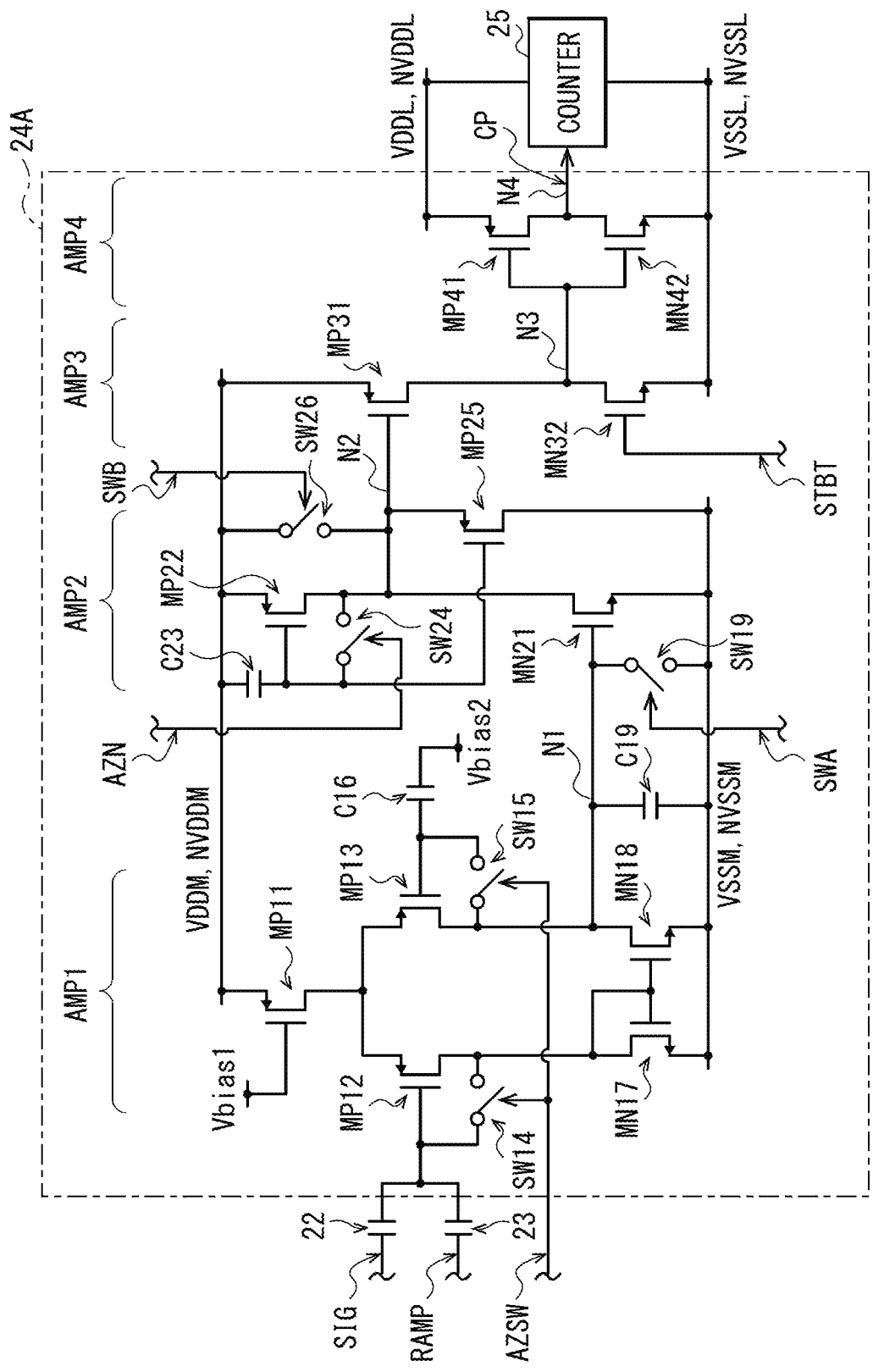
[FIG. 9]

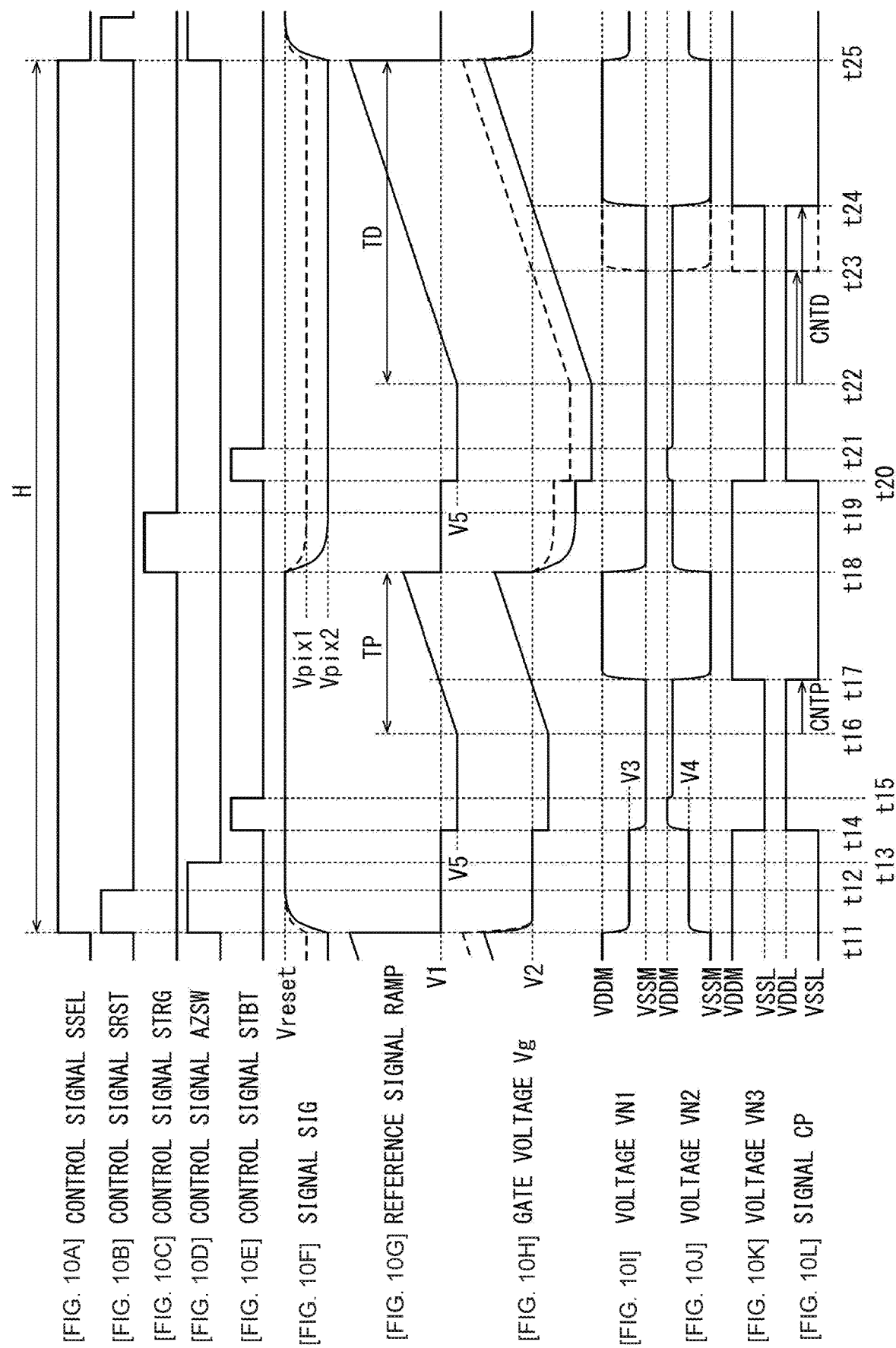

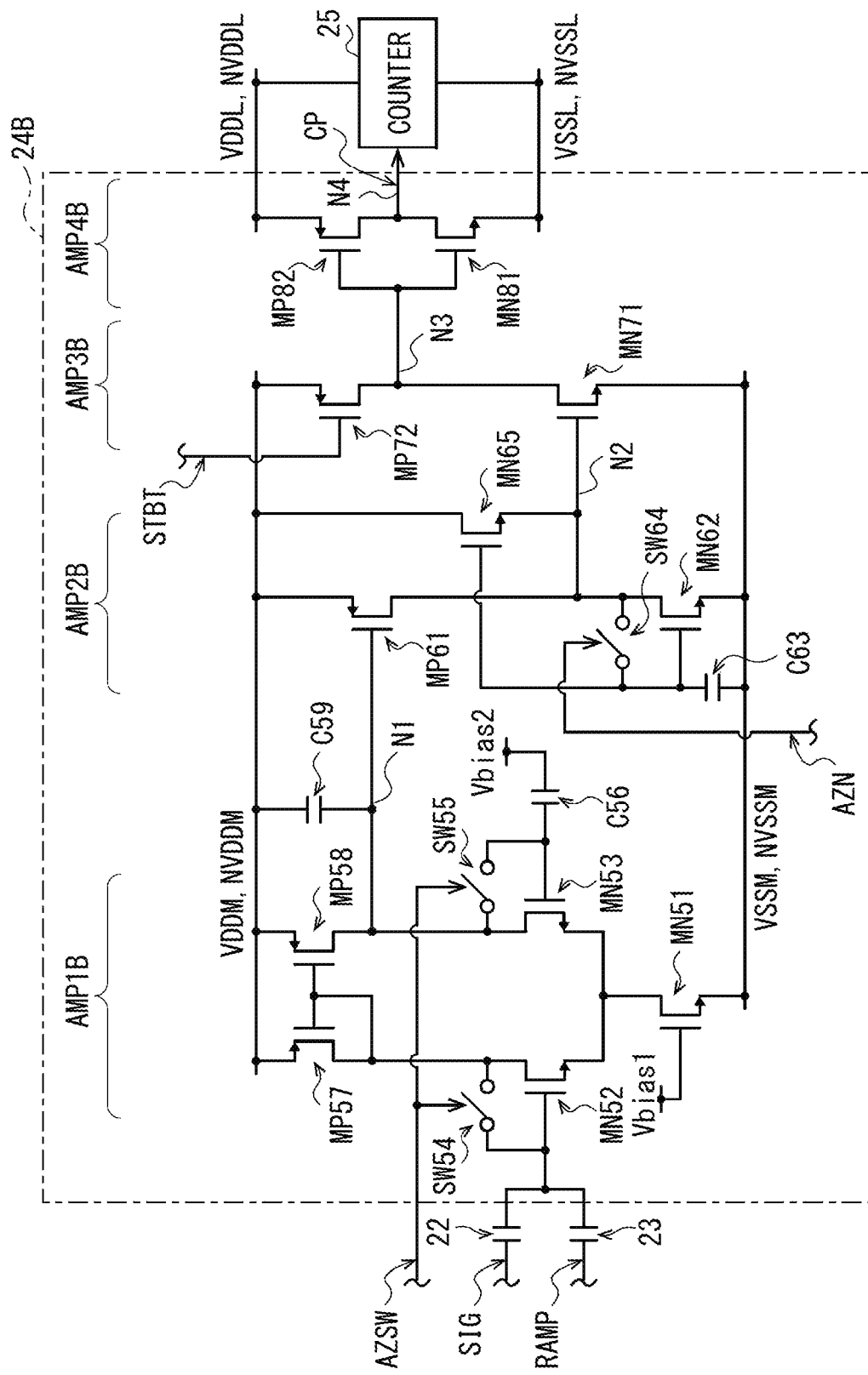
[FIG. 11]

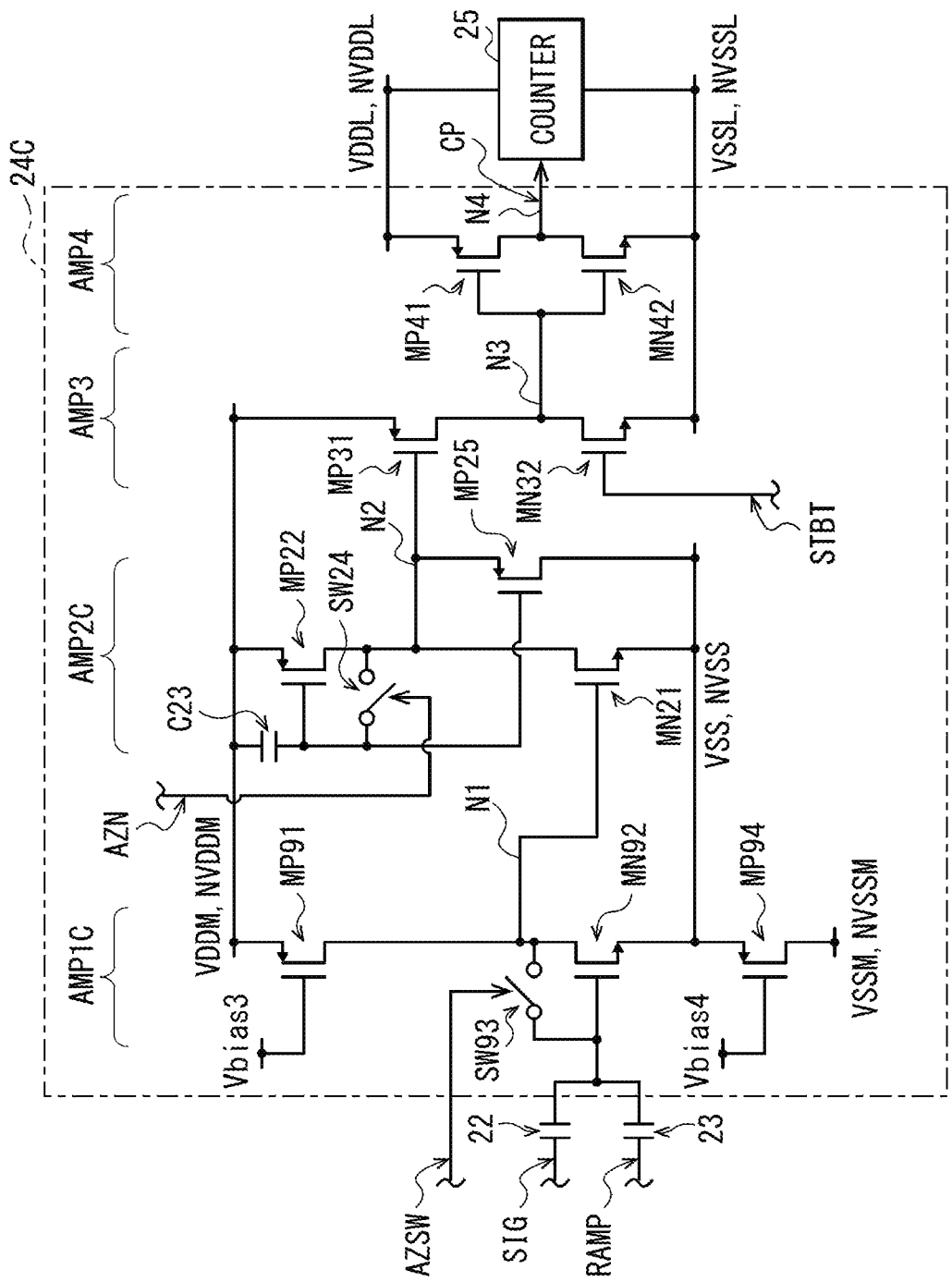
[FIG. 12]

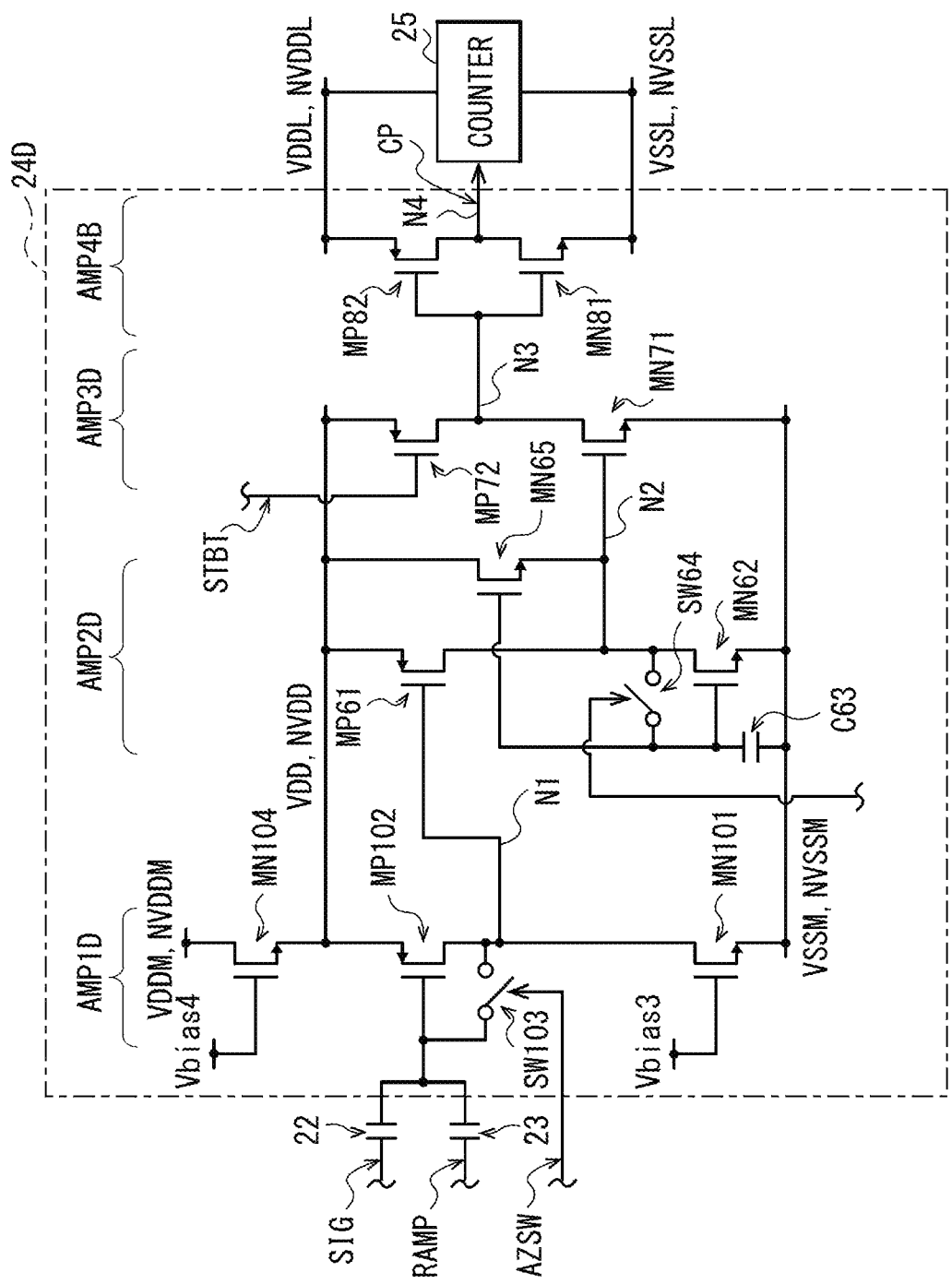
[FIG. 13]

[FIG. 14]
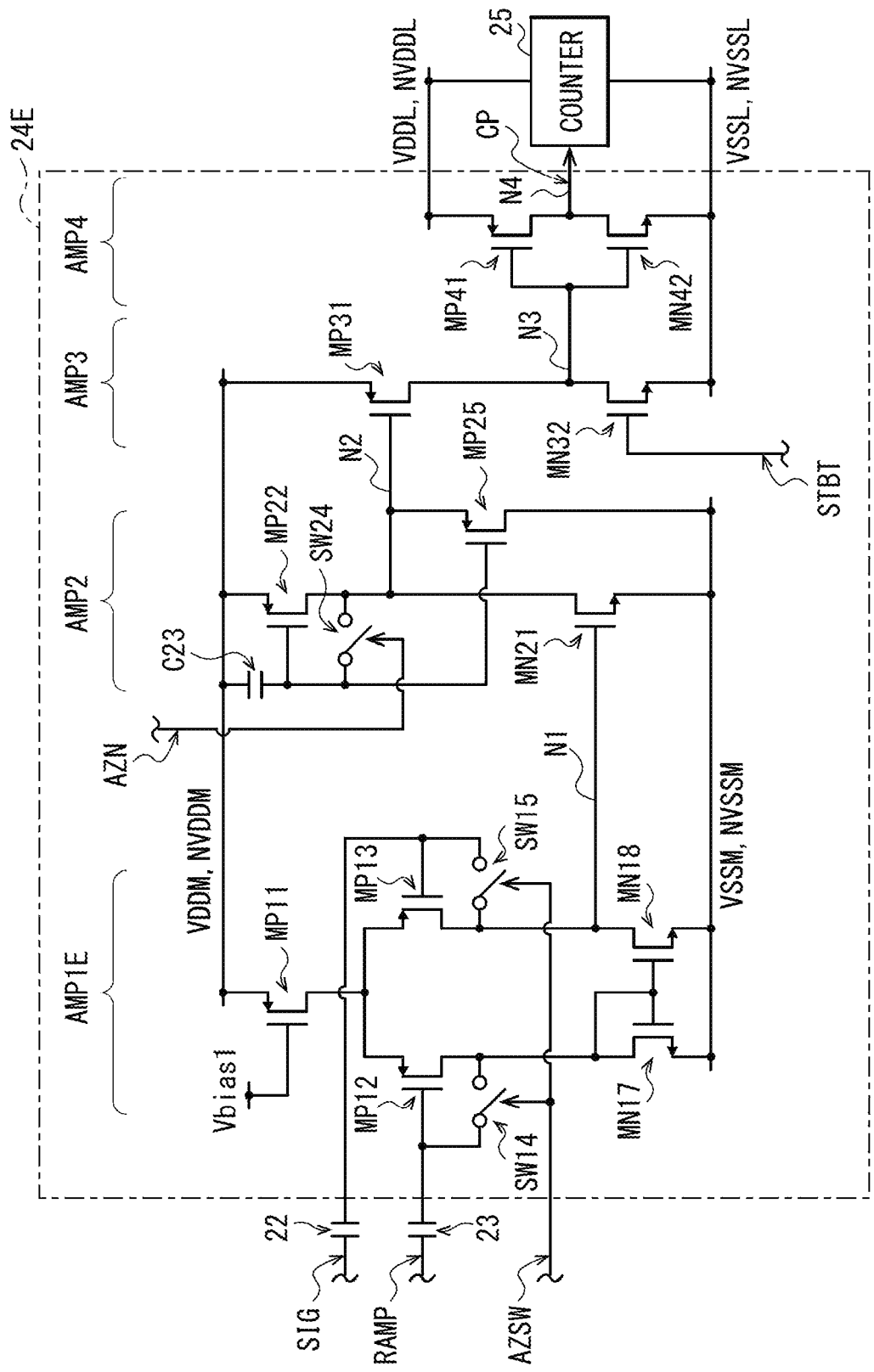

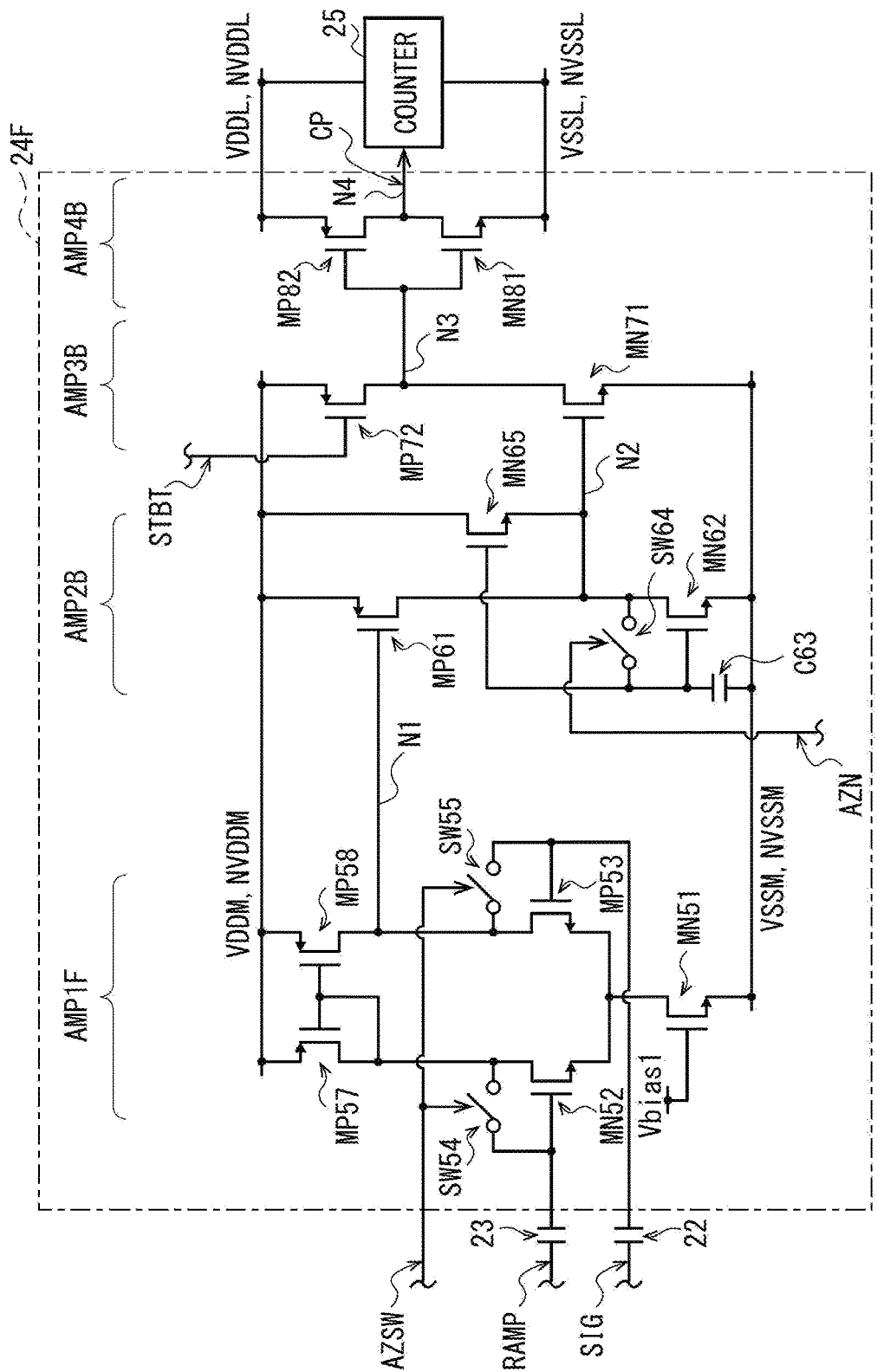
[FIG. 15]

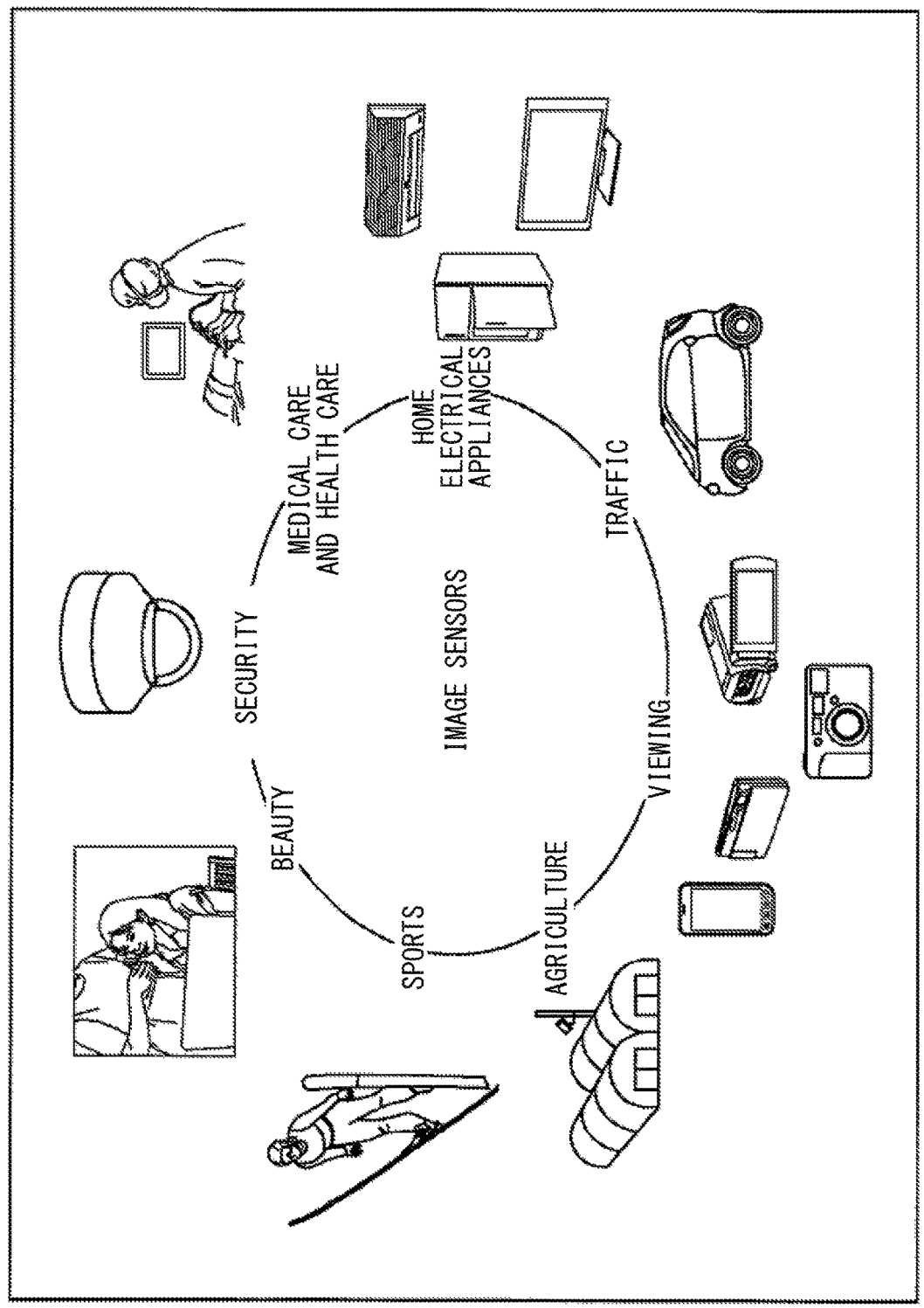

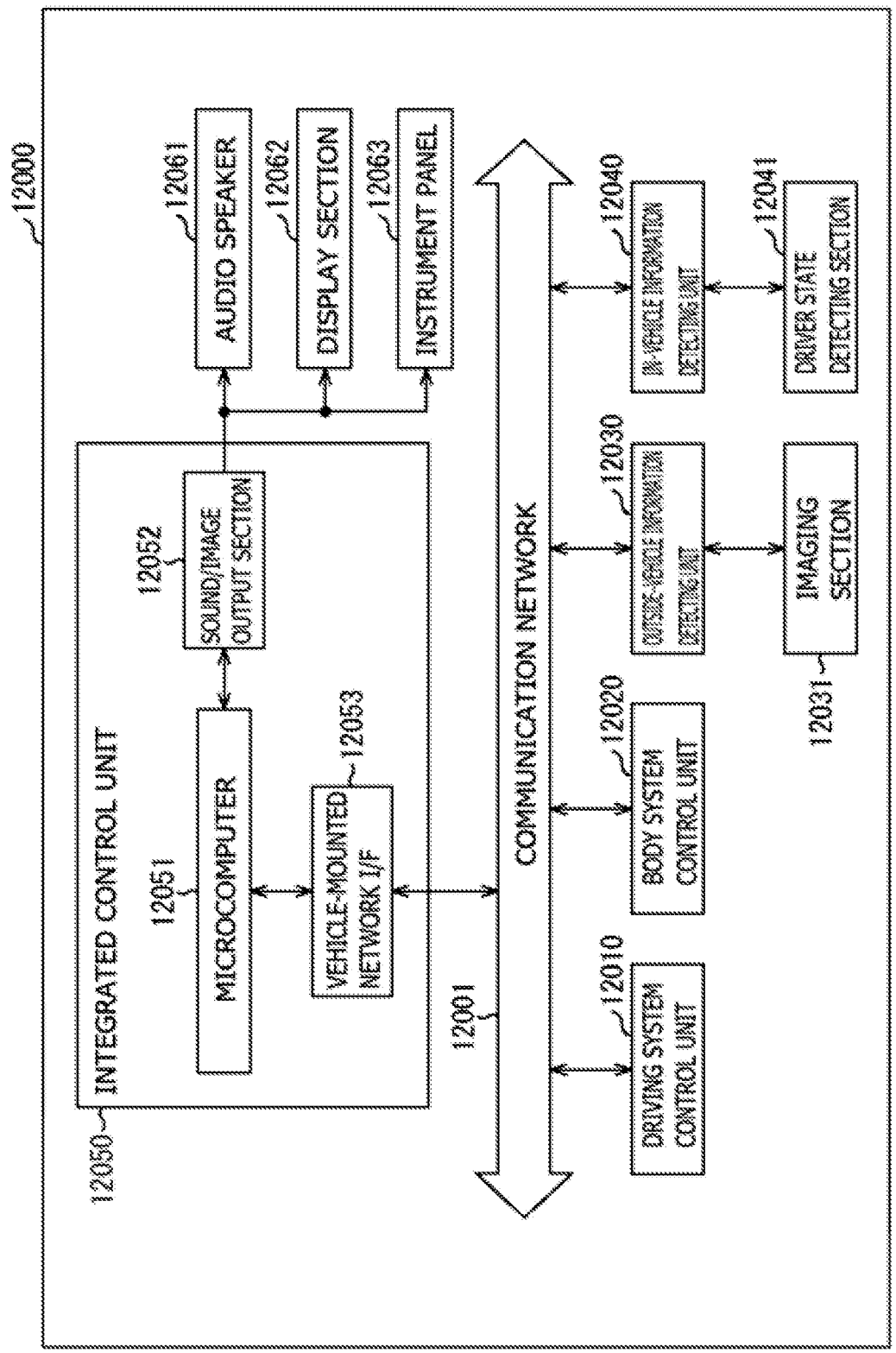
[FIG. 17]

[FIG. 18]
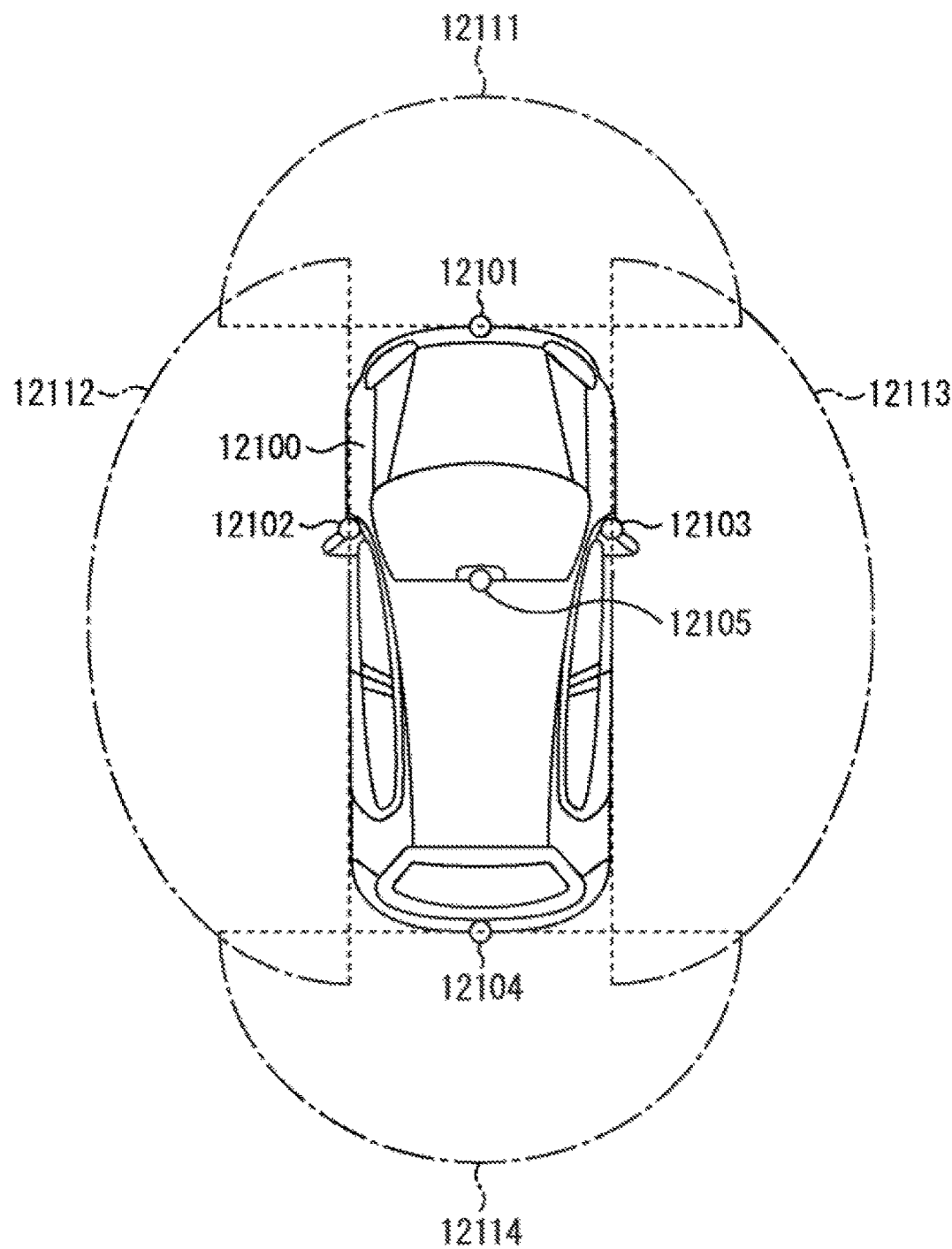

IMAGING DEVICE AND ELECTRONIC APPARATUS

CROSS REFERENCE TO RELATED APPLICATIONS

This application is a U.S. National Phase of International Patent Application No. PCT/JP2021/029636 filed on Aug. 11, 2021, which claims priority benefit of Japanese Patent Application No. JP 2020-143005 filed in the Japan Patent Office on Aug. 26, 2020. Each of the above-referenced applications is hereby incorporated herein by reference in its entirety.

TECHNICAL FIELD

The present disclosure relates to an imaging device that images an object and an electronic apparatus including such an imaging device.

BACKGROUND ART

In an imaging device, frequently, a pixel generates a pixel signal corresponding to the amount of received light and an AD (Analog to Digital) conversion circuit converts the pixel signal into a digital code. For example, PTL 1 discloses an imaging device that performs AD conversion on the basis of a signal having a ramp waveform and a pixel signal. In this imaging device, a differential section and an amplification section and a level shifter and a counter perform AD conversion. The differential section and the amplification section operate on the basis of power supply voltages AVDD and AGND. The level shifter and the counter operate on the basis of power supply voltages DVDD and DGND.

CITATION LIST

Patent Literature

PTL 1: Japanese Unexamined Patent Application Publication No. 2012-147339

SUMMARY OF THE INVENTION

Incidentally, an imaging device is requested to have high image quality and expected to have further higher image quality.

It is desirable to provide an imaging device and an electronic apparatus that are each allowed to have higher image quality.

A first imaging device according to an embodiment of the present disclosure includes a light-receiving pixel, a reference signal generator, a first amplification section, a second amplification section, a third amplification section, and a counter. The light-receiving pixel is configured to generate a pixel signal corresponding to an amount of received light. The reference signal generator is configured to generate a reference signal whose signal level changes with a lapse of time. The first amplification section is coupled to a first power supply node and a second power supply node. The first amplification section is configured to perform a comparison operation on the basis of the pixel signal and the reference signal and output a signal corresponding to a result of the comparison to a first node. The second amplification section includes a first transistor and a first load circuit. The first transistor includes a gate coupled to the first node, a drain coupled to a second node, and a source coupled to the second power supply node. The first load circuit is coupled to the first power supply node and the second node. The third amplification section includes a second transistor and a first switch. The second transistor includes a gate coupled to the second node, a source coupled to the first power supply node, and a drain coupled to a third node. The first switch applies a predetermined voltage to the third node by being turned on. The counter is coupled to a third power supply node and a fourth power supply node. The counter is configured to perform a count operation and stop the count operation on the basis of a voltage of the third node.

A second imaging device according to an embodiment of the present disclosure includes a light-receiving pixel, a reference signal generator, a first amplification section, a second amplification section, a third amplification section, and a counter. The light-receiving pixel is configured to generate a pixel signal. The reference signal generator is configured to generate a reference signal. The first amplification section is coupled to a first power supply node and a second power supply node. The first amplification section is configured to perform a comparison operation on the basis of the pixel signal and the reference signal and output a signal corresponding to a result of the comparison to a first node. The second amplification section includes a first transistor and a first load circuit. The first transistor includes a gate coupled to the first node, a drain coupled to a second node, and a source coupled to the second power supply node. The first load circuit is coupled to the first power supply node and the second node. The third amplification section includes a second transistor and a first switch. The second transistor includes a gate coupled to the second node, a source coupled to the first power supply node, and a drain coupled to a third node. The first switch is turned on and off on the basis of a control signal. The counter is coupled to a third power supply node and a fourth power supply node.

An electronic apparatus according to an embodiment of the present disclosure includes the first imaging device described above. For example, the electronic apparatus corresponds to a smartphone, a digital camera, a video camera, a notebook personal computer, or the like.

In the first imaging device, the second imaging device, and the electronic apparatus according to the respective embodiments of the present disclosure, the light-receiving pixel generates the pixel signal and the reference signal generator generates the reference signal. The first amplification section coupled to the first power supply node and the second power supply node performs the comparison operation on the basis of the pixel signal and the reference signal and outputs the signal corresponding to the result of the comparison to the first node. The second amplification section is provided with the first transistor coupled to the second power supply node and the first load circuit coupled to the first power supply node. The amplified signal is outputted to the second node. The third amplification section is provided with the second transistor coupled to the first power supply node and the first switch. The amplified signal is outputted to the third node. The counter coupled to the third power supply node and the fourth power supply node performs the count operation.

BRIEF DESCRIPTION OF DRAWING

FIG. 1 is a block diagram illustrating a configuration example of an imaging device according to an embodiment of the present disclosure.

FIG. 2 is a circuit diagram illustrating a configuration example of a light-receiving pixel illustrated in FIG. 1.

FIG. 3 is a block diagram illustrating a configuration example of a readout unit illustrated in FIG. 1.

FIG. 4 is a circuit diagram illustrating a configuration example of a comparison circuit illustrated in FIG. 3.

FIG. 5 is a timing chart illustrating an operation example of the imaging device illustrated in FIG. 1.

FIGS. 6A, 6B, 6C. 6D, 6E, 6F, 6G, 6H, 6I, 6J, 6K, and 6L are timing waveform charts illustrating an operation example of the imaging device illustrated in FIG. 1.

FIG. 7 is a circuit diagram illustrating a configuration example of a comparison circuit according to a comparative example.

FIGS. 8A and 8B are timing waveform charts illustrating an operation example of the comparison circuit illustrated in FIG. 4.

FIG. 9 is a circuit diagram illustrating a configuration example of a comparison circuit according to a modification example.

FIGS. 10A, 10B, 10C, 10D, 10E, 10F, 10G, 10H, 10I, 10J, 10K, and 10L are timing waveform charts illustrating an operation example of an imaging device including the comparison circuit illustrated in FIG. 9.

FIG. 11 is a circuit diagram illustrating a configuration example of a comparison circuit according to another modification example.

FIG. 12 is a circuit diagram illustrating a configuration example of a comparison circuit according to another modification example.

FIG. 13 is a circuit diagram illustrating a configuration example of a comparison circuit according to another modification example.

FIG. 14 is a circuit diagram illustrating a configuration example of a comparison circuit according to another modification example.

FIG. 15 is a circuit diagram illustrating a configuration example of a comparison circuit according to another modification example.

FIG. 16 is an explanatory diagram illustrating a usage example of the imaging device.

FIG. 17 is a block diagram depicting an example of schematic configuration of a vehicle control system.

FIG. 18 is a diagram of assistance in explaining an example of installation positions of an outside-vehicle information detecting section and an imaging section.

MODES FOR CARRYING OUT THE INVENTION

The following describes an embodiment of the present disclosure in detail with reference to the drawings. It is to be noted that description is given in the following order.
1. Embodiment
2. Usage Example of Imaging Device
3. Example of Practical Application to Mobile Body 1. First Embodiment

[Configuration Example]

FIG. 1 illustrates a configuration example of an imaging device (imaging device 1) according to an embodiment. The imaging device 1 includes a pixel array 11, a driver 12, a reference signal generator 13, a readout unit 20, a signal processor 15, and an imaging controller 16.

The pixel array 11 includes a plurality of light-receiving pixels P disposed in a matrix. Each of the light-receiving pixels P is configured to generate a signal SIG including a pixel voltage Vpix corresponding to the amount of received light.

FIG. 2 illustrates a configuration example of the light-receiving pixel P. The pixel array 11 includes a plurality of control lines TRGL, a plurality of control lines RSTL, a plurality of control lines SELL, and a plurality of signal lines VSL. Each of the control lines TRGL extends in the horizontal direction (the lateral direction in FIG. 2) and one end thereof is coupled to the driver 12. The driver 12 supplies this control line TRGL with a control signal STRG. Each of the control lines RSTL extends in the horizontal direction and one end thereof is coupled to the driver 12. The driver 12 supplies this control line RSTL with a control signal SRST. Each of the control lines SELL extends in the horizontal direction and one end thereof is coupled to the driver 12. The driver 12 supplies this control line SELL with a control signal SSEL. Each of the signal lines VSL extends in the vertical direction (the longitudinal direction in FIG. 2) and one end thereof is coupled to the readout unit 20. This signal line VSL transfers the signal SIG generated by the light-receiving pixel P to the readout unit 20. The plurality of light-receiving pixels P provided side by side in one row in the horizontal direction (the lateral direction in each of FIGS. 1 and 2) is included in a pixel line L.

Each of the light-receiving pixels P includes a photodiode PD, a transistor TRG, a floating diffusion FD, and transistors RST, AMP, and SEL. The transistors TRG, RST, AMP, and SEL in this example are N-type MOS (Metal Oxide Semiconductor) transistors.

The photodiode PD is a photoelectric conversion element that generates the amount of electric charge corresponding to the amount of received light and accumulates the generated electric charge therein. The anode of the photodiode PD is grounded and the cathode thereof is coupled to the source of the transistor TRG.

The gate of the transistor TRG is coupled to the control line TRGL, the source thereof is coupled to the cathode of the photodiode PD, and the drain thereof is coupled to the floating diffusion FD.

The floating diffusion FD is configured to accumulate the electric charge transferred from the photodiode PD through the transistor TRG. The floating diffusion FD includes, for example, a diffusion layer formed on a surface of a semiconductor substrate. FIG. 2 illustrates the floating diffusion FD by using the symbol of a capacitor.

The gate of the transistor RST is coupled to the control line RSTL, the drain thereof is supplied with a power supply voltage VDDH, and the source thereof is coupled to the floating diffusion FD.

The gate of the transistor AMP is coupled to the floating diffusion FD, the drain thereof is supplied with the power supply voltage VDDH, and the source thereof is coupled to the drain of the transistor SEL.

The gate of the transistor SEL is coupled to the control line SELL, the drain thereof is coupled to the source of the transistor AMP, and the source thereof is coupled to the signal line VSL.

This configuration causes the light-receiving pixel P to discharge the electric charge accumulated in the photodiode PD by turning on the transistors TRG and RST, for example, on the basis of the control signals STRG and SRST. An exposure period T is then started by turning off these transistors TRG and RST and the amount of electric charge corresponding to the amount of received light is accumulated in the photodiode PD. After the exposure period T ends, the light-receiving pixel P then outputs the signal SIG including a reset voltage Vreset and the pixel voltage Vpix to the signal line VSL. Specifically, first, the light-receiving pixel P is electrically coupled to the signal line VSL by turning on of the transistor SEL on the basis of the control signal SSEL. This couples the transistor AMP to a constant current source 21 (described below) of the readout unit 20, causing the transistor AMP to operate as a so-called source follower. Then, in a P-phase (Pre-charge phase) period TP after the voltage of the floating diffusion FD is reset by turning on the transistor RST, the light-receiving pixel P outputs the voltage corresponding to the voltage of the floating diffusion FD at that time as the reset voltage Vreset as described below. In addition, in a D-phase (Data phase) period TD after the electric charge is transferred from the photodiode PD to the floating diffusion FD by turning on the transistor TRG, the light-receiving pixel P outputs the voltage corresponding to the voltage of the floating diffusion FD at that time as the pixel voltage Vpix. A difference voltage between the pixel voltage Vpix and the reset voltage Vreset corresponds to the amount of light received by the light-receiving pixel P in the exposure period T. In this way, the light-receiving pixel P outputs the signal SIG including these reset voltage Vreset and pixel voltage Vpix to the signal line VSL.

The driver 12 (FIG. 1) is configured to sequentially drive the plurality of light-receiving pixels P in the pixel array 11 in units of the pixel lines L on the basis of an instruction from the imaging controller 16. Specifically, the driver 12 drives the plurality of light-receiving pixels P in the pixel array 11 in units of the pixel lines L by supplying the plurality of control lines TRGL in the pixel array 11 with the plurality of respective control signals STRG, supplying the plurality of control lines RSTL with the plurality of respective control signals SRST, and supplying the plurality of control lines SELL with the plurality of respective control signals SSEL.

The reference signal generator 13 is configured to generate a reference signal RAMP on the basis of an instruction from the imaging controller 16. The reference signal RAMP has a so-called ramp waveform in which the voltage level is gradually changed with the lapse of time in the two periods (the P-phase period TP and the D-phase period TD) in which the readout unit 20 performs AD conversion. The reference signal generator 13 supplies the reference signal RAMP like this to the readout unit 20.

The readout unit 20 is configured to generate image data DT0 on the basis of an instruction from the imaging controller 16 by performing AD conversion on the basis of the signal SIG supplied from the pixel array 11 through the signal line VSL.

FIG. 3 illustrates a configuration example of the readout unit 20. It is to be noted that FIG. 3 also illustrates the reference signal generator 13, the signal processor 15, and the imaging controller 16 in addition to the readout unit 20. The readout unit 20 includes the plurality of constant current sources 21, a plurality of AD (Analog to Digital) converters ADC, and a transfer control section 27. The plurality of constant current sources 21 and the plurality of AD converters ADC are provided in association with the plurality of respective signal lines VSL. The following describes the constant current source 21 and the AD converter ADC corresponding to the one certain signal line VSL.

The constant current source 21 is configured to cause a predetermined current to flow through the corresponding signal line VSL. One end of the constant current source 21 is coupled to the corresponding signal line VSL and the other end thereof is grounded.

The AD converter ADC is configured to perform AD conversion on the basis of the signal SIG in the corresponding signal line VSL. The AD converter ADC includes capacitors 22 and 23, a comparison circuit 24, a counter 25, and a latch 26.

One end of the capacitor 22 is coupled to the signal line VSL and supplied with the signal SIG and the other end thereof is coupled to the comparison circuit 24. One end of the capacitor 23 is supplied with the reference signal RAMP supplied from the reference signal generator 13 and the other end thereof is coupled to the comparison circuit 24.

The comparison circuit 24 is configured to generate a signal CP by performing a comparison operation on the basis of the signal SIG supplied from the light-receiving pixel P through the signal line VSL and the capacitor 22 and the reference signal RAMP supplied from the reference signal generator 13 through the capacitor 23. The comparison circuit 24 sets an operating point by setting the voltages of the capacitors 22 and 23 on the basis of control signals AZSW and AZN supplied from the imaging controller 16. After that, the comparison circuit 24 then performs a comparison operation of comparing the reset voltage Vreset included in the signal SIG and the voltage of the reference signal RAMP in the P-phase period TP and performs a comparison operation of comparing the pixel voltage Vpix included in the signal SIG and the voltage of the reference signal RAMP in the D-phase period TD. In addition, the comparison circuit 24 performs even an operation of initializing the voltage of the signal CP on the basis of a control signal STBT supplied from the imaging controller 16 before the P-phase period TP and before the D-phase period TD.

FIG. 4 illustrates a configuration example of the comparison circuit 24. It is to be noted that FIG. 4 also illustrates the capacitors 22 and 23 and the counter 25. The comparison circuit 24 is supplied with a power supply voltage VDDM through a power supply node NVDDM. The comparison circuit 24 is supplied with a power supply voltage VSSM through a power supply node NVSSM. The comparison circuit 24 is supplied with a power supply voltage VDDL through a power supply node NVDDL. The comparison circuit 24 is supplied with a power supply voltage VSSL through a power supply node NVSSL. Each of the power supply voltages VDDM and VSSM is a power supply voltage for an analog circuit. The power supply voltage VDDM is, for example, about 1.8 V to 2.8 V. The power supply voltage VSSM is, for example, 0 V. Each of the power supply voltages VDDL and VSSL is a power supply voltage for a digital circuit. The power supply voltage VDDL is, for example, about 0.75 V. The power supply voltage VSSL is, for example, 0 V. It is to be noted that the power supply voltages VSSM and VSSL are both 0 V in this example, but this is not limitative. For example, the power supply voltage VSSL may be higher than the power supply voltage VSSM. This makes it possible to reduce the power consumption of the digital circuit. In addition, the power supply node NVSSM and the power supply node NVSSL are separately provided in this example, but this is not limitative. There may be provided a common power supply node. The comparison circuit 24 includes amplification sections AMP1 to AMP4.

The amplification section AMP1 is configured to perform a comparison operation on the basis of the signal SIG supplied through the capacitor 22 and the reference signal RAMP supplied through the capacitor 23. The amplification section AMP1 includes transistors MP11 to MP13, switches SW14 and SW15, a capacitor C16, transistors MN17 and MN18, and a capacitor C19. The transistors MP11 to MP13 are P-type MOS transistors and the transistors MN17 and MN18 are N-type MOS transistors. This amplification section AMP1 is coupled to the power supply nodes NVDDM and NVSSM and operates on the basis of the power supply voltages VDDM and VSSM.

The gate of the transistor MP11 is supplied with a bias voltage Vbias1, the source thereof is coupled to the power supply node NVDDM, and the drain thereof is coupled to the sources of the transistors MP12 and MP13. The gate of the transistor MP12 is coupled to the switch SW14 and coupled to the other ends of the capacitors 22 and 23, the source thereof is coupled to the drain of the transistor MP11 and the source of the transistor MP13, and the drain thereof is coupled to the switch SW14, the drain of the transistor MN17, the gate of the transistor MN17, and the gate of the transistor MN18. The gate of the transistor MP13 is coupled to the switch SW15 and the capacitor C16, the source thereof is coupled to the drain of the transistor MP11 and the source of the transistor MP12, and the drain thereof is coupled to a node N1. One end of the switch SW14 is coupled to the gate of the transistor MP12 and coupled to the other ends of the capacitors 22 and 23 and the other end thereof is coupled to the drain of the transistor MP12, the drain of the transistor MN17, the gate of the transistor MN17, and the gate of the transistor MN18. The switch SW14 includes, for example, a MOS transistor. The switch SW14 is turned on and off on the basis of the control signal AZSW. One end of the switch SW15 is coupled to the gate of the transistor MP13 and the capacitor C16 and the other end thereof is coupled to the node N1. The switch SW15 includes, for example, a MOS transistor. The switch SW15 is turned on and off on the basis of the control signal AZSW. One end of the capacitor C16 is supplied with a bias voltage Vbias2 and the other end thereof is coupled to the gate of the transistor MP13 and the one end of the switch SW15. The gate of the transistor MN17 is coupled to the drain of a transistor MN12, the other end of the switch SW14, the drain of the transistor MN17, and the gate of the transistor MN18, the drain thereof is coupled to the drain of the transistor MP12, the other end of the switch SW14, the gate of the transistor MN17, and the gate of the transistor MN18, and the source thereof is coupled to the power supply node NVSSM. The gate of the transistor MN18 is coupled to the drain of the transistor MP12, the other end of the switch SW14, the drain of the transistor MN17, and the gate of the transistor MN17, the drain thereof is coupled to the node N1, and the source thereof is coupled to the power supply node NVSSM. One end of the capacitor C19 is coupled to the node N1 and the other end thereof is coupled to the power supply node NVSSM.

This amplification section AMP1 is a differential amplifier. The transistor MP11 is included in a current source. The transistors MP12 and MP13 are included in a differential pair. The transistors MN17 and MN18 are included in an active load. The node N1 is the output node of this amplification section AMP1. In the amplification section AMP1, the voltages of the capacitors 22, 23, and C16 are set by turning on the switches SW14 and SW15 and an operating point of the amplification section AMP1 is set. After that, the amplification section AMP1 then performs a comparison operation on the basis of the signal SIG and the reference signal RAMP.

The amplification section AMP2 is configured to amplify an output voltage of the amplification section AMP1. The amplification section AMP2 includes transistors MN21 and MP22, a capacitor C23, a switch SW24, and a transistor MP25. The transistor MN21 is an N-type MOS transistor and the transistors MP22 and MP25 are P-type MOS transistors. This amplification section AMP2 is coupled to the power supply nodes NVDDM and NVSSM and operates on the basis of the power supply voltages VDDM and VSSM.

The gate of the transistor MN21 is coupled to the node N1, the drain thereof is coupled to a node N2, and the source thereof is coupled to the power supply node NVSSM. The gate of the transistor MP22 is coupled to the capacitor C23, the switch SW24, and the gate of the transistor MP25, the source thereof is coupled to the power supply node NVDDM, and the drain thereof is coupled to the node N2. One end of the capacitor C23 is coupled to the power supply node NVDDM and the other end thereof is coupled to the gate of the transistor MP22, the switch SW24, and the gate of the transistor MP25. One end of the switch SW24 is coupled to the gate of the transistor MP22, the other end of the capacitor C23, and the gate of the transistor MP25 and the other end thereof is coupled to the node N2. The switch SW24 includes, for example, a MOS transistor. The switch SW24 is turned on and off on the basis of the control signal AZN. The gate of the transistor MP25 is coupled to the gate of the transistor MP22, the other end of the capacitor C23, and the one end of the switch SW24, the source thereof is coupled to the node N2, and the drain thereof is coupled to the power supply node NVSSM.

This amplification section AMP2 is a source-grounded amplifier. The transistor MP22, the capacitor C23, the switch SW24, and the transistor MP25 are included in a load circuit of the transistor MN21. The transistor MP22 is included in the current source. The node N2 is the output node of this amplification section AMP2. In the amplification section AMP2, the voltage of the capacitor C23 is set by turning on the switch SW24 and an operating point of the amplification section AMP2 is set. After that, the amplification section AMP2 is then amplifies an output voltage of the amplification section AMP1.

The amplification section AMP3 is configured to amplify an output voltage of the amplification section AMP2. The amplification section AMP3 includes transistors MP31 and MN32. The transistor MP31 is a P-type MOS transistor and the transistor MN32 is an N-type MOS transistor. This amplification section AMP3 is coupled to the power supply nodes NVDDM and NVSSL and operates on the basis of the power supply voltages VDDM and VSSL. The gate of the transistor MP31 is coupled to the node N2, the source thereof is coupled to the power supply node NVDDM, and the drain thereof is coupled to a node N3. The gate of the transistor MN32 is supplied with the control signal STBT, the drain thereof is coupled to the node N3, and the source thereof is coupled to the power supply node NVSSL. The node N3 is the output node of this amplification section AMP3. In the amplification section AMP3, the node N3 is supplied with the power supply voltage VSSL by turning on the transistor MN32 and the voltage of this node N3 is initialized. After that, the amplification section AMP3 is then amplifies an output voltage of the amplification section AMP2.

The amplification section AMP4 is configured to amplify an output voltage of the amplification section AMP3. The amplification section AMP4 includes transistors MP41 and MN42. The transistor MP41 is a P-type MOS transistor and the transistor MN42 is an N-type MOS transistor. This amplification section AMP4 is coupled to the power supply nodes NVDDL and NVSSL and operates on the basis of the power supply voltages VDDL and VSSL. The gate of the transistor MP41 is coupled to the node N3, the source thereof is coupled to the power supply node NVDDL, and the drain thereof is coupled to a node N4. The gate of the transistor MN42 is coupled to the node N3, the drain thereof is coupled to the node N4, and the source thereof is coupled to the power supply node NVSSL. This amplification section AMP4 is a CMOS (Complementary MOS) amplifier. The node N4 is the output node of this amplification section AMP4. The node N4 is guided to the input terminal of the counter 25.

This configuration causes the comparison circuit 24 to generate the signal CP by performing a comparison operation on the basis of the signal SIG supplied from the light-receiving pixel P through the signal line VSL and the capacitor 22 and the reference signal RAMP supplied from the reference signal generator 13 through the capacitor 23 and output the signal CP to the node N4. In addition, the comparison circuit 24 also has a function of a so-called level shifter that generates the signal CP corresponding to the power supply voltages VDDL and VSSL for digital circuits on the basis of the signal SIG and the reference signal RAMP corresponding to the power supply voltages VDDM and VSSM for analog circuits.

The counter 25 (FIG. 3) is configured to perform a count operation of counting the pulses of a clock signal CLK on the basis of the signal CP supplied from the comparison circuit 24. The clock signal CLK is supplied from the imaging controller 16. Specifically, in the P-phase period TP, the counter 25 generates a count value CNTP by counting the pulses of the clock signal CLK until the transition of the signal CP and outputs this count value CNTP as a digital code having a plurality of bits. In addition, in the D-phase period TD, the counter 25 generates a count value CNTD by counting the pulses of the clock signal CLK until the transition of the signal CP and outputs this count value CNTD as a digital code having a plurality of bits. As illustrated in FIG. 4, the counter 25 is coupled to the power supply nodes NVDDL and NVSSL and operates on the basis of the power supply voltages VDDL and VSSL.

The latch 26 is configured to temporarily hold the digital code supplied from the counter 25 and output the digital code to a bus wiring line BUS on the basis of an instruction from the transfer control section 27.

The transfer control section 27 is configured to perform control on the basis of a control signal CTL supplied from the imaging controller 16 to cause the latches 26 of the plurality of AD converters ADC to sequentially output the digital codes to the bus wiring line BUS. The readout unit 20 uses this bus wiring line BUS to sequentially transfer the plurality of digital codes supplied from the plurality of AD converters ADC to the signal processor 15 as the image data DT0.

The signal processor 15 (FIG. 1) is configured to generate image data DT on the basis of the image data DT0 and an instruction from the imaging controller 16 by performing predetermined image processing. The predetermined image processing includes, for example, a CDS (CDS; Correlated Double Sampling) process. In the CDS process, the signal processor 15 generates a pixel value VAL on the basis of the count value CNTP obtained in the P-phase period TP and the count value CNTD obtained in the D-phase period TD by using the principle of the correlated double sampling. The count value CNTP and the count value CNTD are included in the image data DT0.

The imaging controller 16 is configured to control an operation of the imaging device 1 by supplying the driver 12, the reference signal generator 13, the readout unit 20, and the signal processor 15 with control signals and controlling operations of these circuits. Specifically, the imaging controller 16 performs control by supplying the driver 12 with a control signal to cause the driver 12 to sequentially drive the plurality of light-receiving pixels P in the pixel array 11 in units of the pixel lines L. In addition, the imaging controller 16 performs control by supplying the reference signal generator 13 with a control signal to cause the reference signal generator 13 to generate the reference signal RAMP. In addition, the imaging controller 16 performs control by supplying the readout unit 20 with a control signal to cause the readout unit 20 to generate the image data DT0 by performing AD conversion on the basis of the signal SIG. In addition, the imaging controller 16 controls an operation of the signal processor 15 by supplying the signal processor 15 with a control signal.

Here, the light-receiving pixel P corresponds to a specific example of a "light-receiving pixel" according to the present disclosure. The pixel signal SIG corresponds to a specific example of a "pixel signal" according to the present disclosure. The reference signal generator 13 corresponds to a specific example of a "reference signal generator" according to the present disclosure. The reference signal RAMP corresponds to a specific example of a "reference signal" according to the present disclosure. The amplification section AMP1 corresponds to a specific example of a "first amplification section" according to the present disclosure. The node N1 corresponds to a specific example of a "first node" according to the present disclosure. The amplification section AMP2 corresponds to a specific example of a "second amplification section" according to the present disclosure. The transistor MN21 corresponds to a specific example of a "first transistor" according to the present disclosure. The transistor MP22, the capacitor C23, the switch SW24, and the transistor MP25 each correspond to a specific example of a "first load circuit" according to the present disclosure. The node N2 corresponds to a specific example of a "second node" according to the present disclosure. The amplification section AMP3 corresponds to a specific example of a "third amplification section" according to the present disclosure. The transistor MP31 corresponds to a specific example of a "second transistor" according to the present disclosure. The transistor MN32 corresponds to a specific example of a "first switch" according to the present disclosure. The node N3 corresponds to a specific example of a "third node" according to the present disclosure. The counter 25 corresponds to a specific example of a "counter" according to the present disclosure. The power supply node NVDDM corresponds to a specific example of a "first power supply node" according to the present disclosure. The power supply node NVSSM corresponds to a specific example of a "second power supply node" according to the present disclosure. The power supply node NVDDL corresponds to a specific example of a "third power supply node" according to the present disclosure. The power supply node NVSSL corresponds to a specific example of a "fourth power supply node" according to the present disclosure. The D-phase period TD corresponds to a specific example of a "first period" according to the present disclosure.

The transistor MP22 corresponds to a specific example of a "first load transistor" according to the present disclosure. The capacitor C23 corresponds to a specific example of a "first capacitor" according to the present disclosure. The switch SW24 corresponds to a specific example of a "second switch" according to the present disclosure. The transistor MP25 corresponds to a specific example of a "second load transistor" according to the present disclosure. The transistor MP11 corresponds to a specific example of a "current source" according to the present disclosure. The transistor MP12 corresponds to a specific example of a "third transistor" according to the present disclosure. The transistor MP13 corresponds to a specific example of a "fourth transistor" according to the present disclosure. The capacitor 22 corresponds to a specific example of a "second capacitor" according to the present disclosure. The capacitor 23 corresponds to a specific example of a "third capacitor" according to the present disclosure. The switch SW14 corresponds to a specific example of a "third switch" according to the present disclosure. The switch SW15 corresponds to a specific example of a "fourth switch" according to the present disclosure. Each of the transistors MN17 and MN18 corresponds to a specific example of a "second load circuit" according to the present disclosure.

[Operations and Workings]

Subsequently, the operations and workings of the imaging device 1 according to the present embodiment are described.

(Overview of Overall Operation)

First, an overview of the overall operation of the imaging device 1 is described with reference to FIGS. 1 and 3. The driver 12 sequentially drives the plurality of light-receiving pixels P in the pixel array 11 in units of the pixel lines L on the basis of an instruction from the imaging controller 16. The reference signal generator 13 generates the reference signal RAMP on the basis of an instruction from the imaging controller 16. The light-receiving pixel P outputs the reset voltage Vreset as the signal SIG in the P-phase period TP and outputs the pixel voltage Vpix corresponding to the amount of received light as the signal SIG in the D-phase period TD. The readout unit 20 generates the image data DT0 on the basis of the signal SIG supplied from the pixel array 11 through the signal line VSL and an instruction from the imaging controller 16. Specifically, in the readout unit 20, the AD converter ADC generates the count value CNTP on the basis of the signal SIG by performing AD conversion in the P-phase period TP and outputs this count value CNTP as a digital code having a plurality of bits. In addition, the AD converter ADC generates the count value CNTD on the basis of the signal SIG by performing AD conversion in the D-phase period TD and outputs this count value CNTD as a digital code having a plurality of bits. The readout unit 20 sequentially supplies the plurality of digital codes including the count values CNTP generated by the plurality of AD converters ADC and the plurality of digital codes including the count values CNTD generated by the plurality of AD converters ADC to the signal processor 15 through the bus wiring line BUS as the image data DT0. The signal processor 15 generates the image data DT on the basis of the image data DT0 and an instruction from the imaging controller 16 by performing predetermined image processing.

(Detailed Operation)

In the imaging device 1, each of the plurality of light-receiving pixels P accumulates electric charge in accordance with the amount of received light and generates the signal SIG including the pixel voltage Vpix corresponding to the amount of received light. The readout unit 20 then performs AD conversion on the basis of this signal SIG. The following describes this operation in detail.

FIG. 5 illustrates an example of an operation of scanning the plurality of light-receiving pixels P in the pixel array 11 in units of the pixel lines L.

The imaging device 1 performs exposure start driving D1 on the pixel array 11 in order from top in the vertical direction in the period from a timing t0 to a timing t1. Specifically, the driver 12 sequentially selects the pixel lines L, for example, by generating the control signals STRG and SRST. The driver 12 sequentially turns on the transistors TRG and RST in the light-receiving pixels P and keeps on the transistors TRG and RST for a time having a predetermined length. This sets the voltage of the floating diffusion FD and the voltage of the cathode of the photodiode PD to the power supply voltage VDDH in each of the light-receiving pixels P. In a case where the transistors TRG and RST are then turned off, the photodiode PD starts to accumulate electric charge in accordance with the amount of received light. In this way, the exposure periods T sequentially start in the plurality of light-receiving pixels P.

The imaging device 1 then performs readout driving D2 on the pixel array 11 in order from top in the vertical direction in the period from a timing t2 to a timing t3. Specifically, the driver 12 sequentially selects the pixel lines L by generating the control signals STRG, SRST, and SSEL as described below. This causes the light-receiving pixel P to output the reset voltage Vreset as the signal SIG in the P-phase period TP and output the pixel voltage Vpix as the signal SIG in the D-phase period TD. The readout unit 20 performs AD conversion on the basis of the signal SIG including the reset voltage Vreset and the pixel voltage Vpix outputted from the light-receiving pixel P.

The imaging device 1 repeats the exposure start driving D1 and the readout driving D2 like these. This allows the imaging device 1 to obtain a series of captured images.

Next, the readout driving D2 is described in detail. The following focuses on the certain light-receiving pixel P and describes operations of this light-receiving pixel P and the AD converter ADC coupled to the light-receiving pixel P in detail.

FIGS. 6A, 6B, 6C, 6D, 6E, 6F, 6G, 6H, 6I, 6J, 6K, and 6L illustrate an operation examples of the readout driving D2. FIG. 6A illustrates the waveform of the control signal SSEL. FIG. 6B illustrates the waveform of the control signal SRST. FIG. 6C illustrates the waveform of the control signal STRG. FIG. 6D illustrates the waveform of the control signal AZSW. FIG. 6E illustrates the waveform of the control signal STBT. FIG. 6F illustrates the waveform of the signal SIG. FIG. 6G illustrates the waveform of the reference signal RAMP. FIG. 6H illustrates the waveform of a gate voltage Vg of the transistor MP12 in the comparison circuit 24 of the AD converter ADC. FIG. 6I illustrates the waveform of a voltage VN1 at the node N1 of the comparison circuit 24. FIG. 6J illustrates the waveform of a voltage VN2 at the node N2. FIG. 6K illustrates the waveform of a voltage VN3 at the node N3. FIG. 6L illustrates the waveform of the signal CP at the node N4. The waveform of the control signal AZN is similar to the waveform of the control signal AZSW (FIG. 6D).

In the imaging device 1, in a certain horizontal period (H), the light-receiving pixel P first outputs the reset voltage Vreset by performing a reset operation and the AD converter ADC performs AD conversion on the basis of the reset voltage Vreset in the P-phase period TP. The light-receiving pixel P then outputs the pixel voltage Vpix by performing an electric charge transfer operation after that and the AD converter ADC performs AD conversion on the basis of the pixel voltage Vpix in the D-phase period TD. The following describes this operation in detail.

First, the horizontal period H starts at a timing t11 and the driver 12 then changes the voltage of the control signal SSEL from the low level to the high level (FIG. 6A). This turns on the transistor SEL in the light-receiving pixel P and electrically couples the light-receiving pixel P to the signal line VSL. In addition, at this timing t11, the driver 12 changes the voltage of the control signal SRST from the low level to the high level (FIG. 6B). This turns on the transistor RST in the light-receiving pixel P and sets the voltage of the floating diffusion FD to the power supply voltage VDDH (reset operation). The light-receiving pixel P then outputs the voltage (reset voltage Vreset) corresponding to the voltage of the floating diffusion FD at this time. In this way, the voltage of the signal SIG is changed to the reset voltage Vreset (FIG. 6F).

In addition, at this timing t11, the reference signal generator 13 sets the reference signal RAMP to a voltage V1 (FIG. 6G). In addition, at this timing t11, the imaging controller 16 changes each of the voltages of the control signals AZSW and AZN from the low level to the high level (FIG. 6D). This turns on all the switches SW14, SW15, and SW24 in the comparison circuit 24 of the AD converter ADC. The gate voltage Vg of the transistor MP12 is changed to the same voltage (voltage V2) as the drain voltage of the transistor MP12 by turning on the switch SW14 (FIG. 6H) and the voltages of the capacitors 22 and 23 are set. The gate voltage of the transistor MP13 is similarly changed to the same voltage as the drain voltage of the transistor MP13 by turning on the switch SW15 and the voltage of the capacitor C16 is set and the voltage VN1 of the node N1 is changed to a voltage V3 (FIG. 6I). In addition, the gate voltage of the transistor MP22 is changed to the same voltage as the drain voltage of the transistor MP22 by turning on the switch SW24 and the voltage of the capacitor C23 is set and the voltage VN2 is changed to a voltage V4 (FIG. 6J). In this way, an operating point is set in the comparison circuit 24.

Next, at the timing t12, the driver 12 changes the voltage of the control signal SRST from the high level to the low level (FIG. 6B). This turns off the transistor RST in the light-receiving pixel P and finishes the reset operation.

Next, at the timing t13, the imaging controller 16 changes each of the voltages of the control signals AZSW and AZN from the high level to the low level (FIG. 6D). This turns off all the switches SW14, SW15, and SW24 in the comparison circuit 24 of the AD converter ADC and finishes the operation of setting an operating point. From this point onward, the comparison circuit 24 operates to compare the gate voltage Vg and the voltage V2.

Next, at a timing t14, the reference signal generator 13 decreases the voltage of the reference signal RAMP from the voltage V1 to a voltage V5 (FIG. 6G). This causes the gate voltage Vg of the transistor MP12 to be lower than the voltage V2 in the comparison circuit 24 of the AD converter ADC (FIG. 6H). The voltage VN1 of the node N1 is thus decreased to the power supply voltage VSSM (FIG. 6I) and the voltage VN2 of the node N2 is increased (FIG. 6J). In this way, an increase in the voltage VN2 causes the source voltage of the transistor MP25 to be higher than the gate voltage of the transistor MP25 to turn on the transistor MP25. As a result, the voltage VN2 is clamped by the transistor MP25 to a voltage slightly lower than the power supply voltage VDDM.

In addition, at this timing t14, the imaging controller 16 changes the voltage of the control signal STBT from the low level to the high level (FIG. 6E). This turns on the transistor MN32 in the comparison circuit 24 of the AD converter ADC and sets the voltage VN3 of the node N3 to the power supply voltage VSSL (FIG. 6K). At this time, the voltage VN2 of the node N2 is a voltage close to the power supply voltage VDDM. The transistor MP31 is thus off and no current flows in the amplification section AMP3. In this way, the voltage VN3 is set to the power supply voltage VSSL. This sets the voltage of the signal CP at the node N4 to the high level (power supply voltage VDDL) (FIG. 6L). In this way, the voltage VN3 is initialized and the voltage of the signal CP is initialized.

Next, at a timing t15, the imaging controller 16 changes the voltage of the control signal STBT from the high level to the low level (FIG. 6E). This turns off the transistor MN32 in the comparison circuit 24 of the AD converter ADC.

Next, in the period (P-phase period TP) from a timing t16 to a timing t18, the AD converter ADC performs AD conversion on the basis of the reset voltage Vreset. Specifically, first, at the timing t16, the reference signal generator 13 starts to increase the voltage of the reference signal RAMP from the voltage V5 at a predetermined change rate (FIG. 6G). Accordingly, in the comparison circuit 24 of the AD converter ADC, the gate voltage Vg of the transistor MP12 starts to increase (FIG. 6H). In addition, at this timing t16, the imaging controller 16 starts to generate the clock signal CLK. The counter 25 of the AD converter ADC counts the pulses of this clock signal CLK by performing a count operation.

Then, at the timing t17, the gate voltage Vg exceeds the voltage V2 (FIG. 6H). This changes the voltage VN1 of the node N1 from the low level (power supply voltage VSSM) to the high level (power supply voltage VDDM) in the comparison circuit 24 of the AD converter ADC (FIG. 6I), changes the voltage VN2 of the node N2 from the high level (a voltage slightly lower than the power supply voltage VDDM) to the low level (power supply voltage VSSM) (FIG. 6J), changes the voltage VN3 of the node N3 from the low level (power supply voltage VSSL) to the high level (power supply voltage VDDM) (FIG. 6K), and changes the voltage of the signal CP from the high level (power supply voltage VDDL) to the low level (power supply voltage VSSL) (FIG. 6L). In other words, the comparison circuit 24 compares the gate voltage Vg and the voltage V2. The gate voltage Vg exceeds the voltage V2 and the comparison circuit 24 thus changes the voltage of the signal CP from the high level to the low level. The counter 25 of the AD converter ADC stops the count operation on the basis of this transition of the signal CP. The count value (count value CNTP) of the counter 25 at this time is a value corresponding to the reset voltage Vreset. The latch 26 of the AD converter ADC holds this count value CNTP. The counter 25 then resets the count value.

Next, at the timing t18, the reference signal generator 13 sets the voltage of the reference signal RAMP to the voltage V1 at the end of the P-phase period TP. In addition, the imaging controller 16 stops the generation of the clock signal CLK at this timing t18. In a period from the timing t18 or a later timing, the readout unit 20 supplies the count value CNTP held by the latch 26 to the signal processor 15 as the image data DT0.

At this timing t18, the driver 12 then changes the voltage of the control signal STRG from the low level to the high level (FIG. 6C). This turns on the transistor TRG in the light-receiving pixel P. Electric charge generated in the photodiode PD is transferred to the floating diffusion FD (electric charge transfer operation). The light-receiving pixel P then outputs the voltage (pixel voltage Vpix) corresponding to the voltage of the floating diffusion FD at this time. In this way, the voltage of the signal SIG is changed to the pixel voltage Vpix (FIG. 6F). FIGS. 6A, 6B, 6C, 6D, 6E, 6F, 6G, 6H, 6I, 6J, 6K, and 6L illustrate examples of the two pixel voltages Vpix (pixel voltages Vpix1 and Vpix2) different from each other. The voltage Vpix1 is the pixel voltage Vpix in a case where the light-receiving pixel P receives a small amount of light. The voltage Vpix2 is the pixel voltage Vpix in a case where the light-receiving pixel P receives a large amount of light. The voltage of the signal SIG is decreased in this way. This decreases the gate voltage Vg of the transistor MP12 in the comparison circuit 24 of the AD converter ADC (FIG. 6H). The gate voltage Vg is changed by a voltage corresponding to the pixel voltage Vpix. In this case, a decrease in the gate voltage Vg decreases the voltage VN1 of the node N1 to the power supply voltage VSSM in the comparison circuit 24 of the AD converter ADC (FIG. 6I) and increases the voltage VN2 of the node N2 (FIG. 6J). In this way, an increase in the voltage VN2 causes the source voltage of the transistor MP25 to be higher than the gate voltage of the transistor MP25 to turn on the transistor MP25. As a result, the voltage VN2 is clamped by the transistor MP25 to a voltage slightly lower than the power supply voltage VDDM. In a case where the voltage VN2 is changed to a voltage slightly lower than the power supply voltage VDDM, the transistor MP31 is turned off and the node N3 enters a floating state. The voltage of the node N3 therefore remains at the high level (power supply voltage VDDM) (FIG. 6K) and the voltage of the signal CP remains at the low level (power supply voltage VSSL) (FIG. 6L).

Next, at the timing t19, the driver 12 changes the voltage of the control signal STRG from the high level to the low level (FIG. 6C). This turns off the transistor TRG in the light-receiving pixel P and finishes the electric charge transfer operation.

Next, at a timing t20, the reference signal generator 13 decreases the voltage of the reference signal RAMP from the voltage V1 to the voltage V5 (FIG. 6G). This decreases the gate voltage Vg of the transistor MP12 in the comparison circuit 24 of the AD converter ADC (FIG. 6H).

In addition, at this timing t20, the imaging controller 16 changes the voltage of the control signal STBT from the low level to the high level (FIG. 6E). This turns on the transistor MN32 in the comparison circuit 24 of the AD converter ADC and sets the voltage VN3 of the node N3 to the power supply voltage VSSL (FIG. 6K). At this time, the voltage VN2 of the node N2 is a voltage close to the power supply voltage VDDM. The transistor MP31 is thus off and no current flows in the amplification section AMP3. In this way, the voltage VN3 is set to the power supply voltage VSSL. This sets the voltage of the signal CP at the node N4 to the high level (power supply voltage VDDL) (FIG. 6L). In this way, the voltage VN3 is initialized and the voltage of the signal CP is initialized.

Next, at a timing t21, the imaging controller 16 changes the voltage of the control signal STBT from the high level to the low level (FIG. 6E). This turns off the transistor MN32 in the comparison circuit 24 of the AD converter ADC.

Next, in the period (D-phase period TD) from a timing t22 to a timing t24, the AD converter ADC performs AD conversion on the basis of the pixel voltage Vpix. Specifically, first, at the timing t22, the reference signal generator 13 starts to increase the voltage of the reference signal RAMP from the voltage V5 at a predetermined change rate (FIG. 6G). Accordingly, in the comparison circuit 24 of the AD converter ADC, the gate voltage Vg of the transistor MP12 starts to increase (FIG. 6H). In addition, at this timing t22, the imaging controller 16 starts to generate the clock signal CLK. The counter 25 of the AD converter ADC counts the pulses of this clock signal CLK by performing a count operation.

In a case where the pixel voltage Vpix is the voltage Vpix1, the gate voltage Vg exceeds the voltage V2 at a timing t23 (FIG. 6H). This changes the voltage VN1 of the node N1 from the low level (power supply voltage VSSM) to the high level (power supply voltage VDDM) in the comparison circuit 24 of the AD converter ADC (FIG. 6I), changes the voltage VN2 of the node N2 from the high level (a voltage slightly lower than the power supply voltage VDDM) to the low level (power supply voltage VSSM) (FIG. 6J), changes the voltage VN3 of the node N3 from the low level (power supply voltage VSSL) to the high level (power supply voltage VDDM) (FIG. 6K), and changes the voltage of the signal CP from the high level (power supply voltage VDDL) to the low level (power supply voltage VSSL) (FIG. 6L). In other words, the comparison circuit 24 compares the gate voltage Vg and the voltage V2. The gate voltage Vg exceeds this voltage V2 and the comparison circuit 24 thus changes the voltage of the signal CP from the high level to the low level.

In addition, in a case where the pixel voltage Vpix is the voltage Vpix2, the gate voltage Vg exceeds the voltage V2 at the timing t24 (FIG. 6H). This causes the comparison circuit 24 of the AD converter ADC to similarly change the voltage of the signal CP from the high level to the low level (FIGS. 6I, 6J, 6K, and 6L).

The counter 25 of the AD converter ADC stops the count operation on the basis of this transition of the signal CP. The count value (count value CNTD) of the counter 25 at this time is a value corresponding to the pixel voltage Vpix. The latch 26 of the AD converter ADC holds this count value CNTD. The counter 25 then resets the count value.

Next, at a timing t25, the reference signal generator 13 sets the voltage of the reference signal RAMP to the voltage V1 at the end of the D-phase period TD (FIG. 6G). In addition, the imaging controller 16 stops the generation of the clock signal CLK at this timing t25. In a period from the timing t25 or a later timing, the readout unit 20 supplies the count value CNTD held by the latch 26 to the signal processor 15 as the image data DT0.

The driver 12 then changes the voltage of the control signal SSEL from the high level to the low level at this timing t25 (FIG. 6A). This turns off the transistor SEL in the light-receiving pixel P and electrically uncouples the light-receiving pixel P from the signal line VSL.

In this way, the readout unit 20 supplies the image data DT0 including the count values CNTP and CNTD to the signal processor 15. The signal processor 15 generates the pixel value VAL, for example, on the basis of the count values CNTP and CNTD included in the image data DT0 by using the principle of correlated double sampling. Specifically, the signal processor 15 generates the pixel value VAL, for example, by subtracting the count value CNTP from the count value CNTD. In this way, the signal processor 15 generates the image data DT by performing a predetermined process.

In this way, the imaging device 1 performs a count operation on the basis of the reset voltage Vreset in the P-phase period TP to acquire the count value CNTP and performs a count operation on the basis of the pixel voltage Vpix in the D-phase period TD to acquire the count value CNTD. The imaging device 1 then generates the pixel value VAL on the basis of the count values CNTP and CNTD by using the principle of correlated double sampling. The imaging device 1 performs such correlated double sampling. It is thus possible to remove the noise component included in the pixel voltage Vpix. As a result, it is possible to increase the image quality of a captured image.

As illustrated in FIG. 4, in the imaging device 1, the amplification section AMP3 is coupled to the power supply node NVDDM. In addition, the transistor MN32 is provided that couples the source of the transistor MP31 of amplification section AMP3 to the power supply node NVDDM and initializes the voltage of the node N3. This makes it possible to suppress the influence of fluctuations in the power supply voltages VDDM and VDDL on a count value of the counter 25 as described below in comparison with a comparative example.

(Comparative Example)

Next, an imaging device 1R according to the comparative example is described. In the present comparative example, the comparison circuit 24 has a different configuration from that of the present embodiment. The other configurations are similar to those of the imaging device 1 (FIGS. 1, 3, and the like) according to the present embodiment.

FIG. 7 illustrates a configuration example of a comparison circuit 24R in the imaging device 1R. The comparison circuit 24R includes amplification sections AMP2R and AMP3R.

The amplification section AMP2R includes the transistors MN21 and MP22, the capacitor C23, and the switch SW24. In other words, the amplification section AMP2R is obtained by omitting the transistor MP25 from the amplification section AMP3 of the comparison circuit 24 (FIG. 4) according to the present embodiment.

The amplification section AMP3R includes transistors MP33 and MN34. The transistor MP33 is a P-type MOS transistor and the transistor MN34 is an N-type MOS transistor. This amplification section AMP3R is coupled to the power supply nodes NVDDL and NVSSL and operates on the basis of the power supply voltages VDDL and VSSL. In other words, in the comparison circuit 24 (FIG. 4) according to the present embodiment, the amplification section AMP3 is coupled to the power supply node NVDDM. In the comparison circuit 24R according to the present comparative example, the amplification section AMP3R is, however, coupled to the power supply node NVDDL. The gate of the transistor MP33 is coupled to the node N2, the source thereof is coupled to the power supply node NVDDL, and the drain thereof is coupled to the node N3. The gate of the transistor MN34 is coupled to the node N2, the drain thereof is coupled to the node N3, and the source thereof is coupled to the power supply node NVSSL. The amplification section AMP3R is a CMOS amplifier unlike the amplification section AMP3R of the comparison circuit 24 (FIG. 4) according to the present embodiment.

In this way, in the comparison circuit 24R, the amplification sections AMP1 and AMP2R operate on the basis of the power supply voltages VDDM and VSSM and the amplification sections AMP3R and AMP4 operate on the basis of the power supply voltages VDDL and VSSL.

The amplification section AMP3R is a CMOS amplifier. In a case where the voltage VN2 that is an input voltage is higher than the logic threshold of the CMOS amplifier, the voltage VN3 that is an output voltage is thus set to the low level. In a case where the voltage VN2 is lower than the logic threshold, the voltage VN3 is set to the high level. This logic threshold is set, for example, to about an intermediate voltage between the power supply voltage VDDL and the power supply voltage VSSL.

The power supply voltage VDDL is supplied to the digital circuit and the power supply voltage VDDL thus has, for example, much noise such as switching noise. In a case where the supply voltage VDDL fluctuates, the logic threshold also fluctuates. This may deviate the transition timing of the voltage VN3 in accordance with a fluctuation in the power supply voltage VDDL, for example, in a case where the voltage VN2 of the node N2 has a low slew rate. In particular, the node N1 that is the output node of the amplification section AMP1 is provided with the capacitor C19 to reduce noise in this example. The voltage VN1 of the node N1 thus has a low slew rate. As a result, the voltage VN2 of the node N2 has a low slew rate. This voltage VN2 is inputted to the amplification section AMP3R. The amplification section AMP3R is the initial-stage circuit of the circuits that operate on the basis of the power supply voltage VDDL. In this way, the voltage VN2 has a low slew rate and the transition timing of the voltage VN3 thus deviates in accordance with a fluctuation in the power supply voltage VDDL. As a result, the counter 25 has a deviated count value and the pixel value VAL corresponding to the amount of received light also deviates from the original value.

In contrast, in the comparison circuit 24 (FIG. 4) according to the present embodiment, the amplification section AMP3 is coupled to the power supply node NVDDM. This causes the three amplification sections AMP1, AMP2, and AMP3 to operate on the basis of the power supply voltage VDDM. It is thus possible to cause the voltage VN3 to have a higher slew rate. The voltage VN3 is inputted to the amplification section AMP4 that is the initial-stage circuit of the circuits which operate on the basis of the power supply voltage VDDL. Even in a case where the power supply voltage VDDL fluctuates, it is thus possible for the comparison circuit 24 to reduce the possibility that the transition timing of the voltage VN3 deviates in accordance with the fluctuation. This makes it possible to reduce the influence of the fluctuation in the power supply voltage VDDL on the pixel value VAL.

In addition, in the comparison circuit 24 according to the present embodiment, the transistor MN32 is provided that couples the source of the transistor MP31 of amplification section AMP3 to the power supply node NVDDM and initializes the voltage of the node N3. This causes the amplification section AMP3 to operate on the basis of the voltage VN2 of the node N2 that is an input voltage by turning on and off only the transistor MP31. Specifically, the amplification section AMP3 operates on the basis of the magnitude relationship between the voltage of the node N2 and a threshold voltage Vth of the transistor MP31 as viewed from the power supply node NVDDM. Even in a case where, for example, the power supply voltage VDDM for an analog circuit fluctuates, it is thus possible for the comparison circuit 24 to reduce the influence of this fluctuation in the power supply voltage VDDM on the transition timing of the voltage VN3. This makes it possible to reduce the influence of the fluctuation in the power supply voltage VDDM on the pixel value VAL.

In particular, in this example, in a case where the voltage VN2 of the node N2 is at the high level, this voltage VN2 is clamped by the transistor MP25. This makes it possible to secure the drain and source voltages of the transistor MP22 that is a current source to some degree even in a case where the voltage VN2 of the node N2 is at the high level. The gate voltage of this transistor MP25 is a voltage set by the capacitor C23. The voltage between both ends of this capacitor C23 is maintained. Thus, for example, in a case where the power supply voltage VDDM fluctuates, the gate voltage of the transistor MP25 also fluctuates. This also fluctuates the voltage VN2 clamped by the transistor MP25 as with the power supply voltage VDDM. In this way, the source voltage and the gate voltage of the transistor MP31 fluctuate in the same manner. This makes it possible to reduce the influence of a fluctuation in the power supply voltage VDDM on the deviation of the transition timing of the voltage VN3 as described below.

FIGS. 8A and 8B illustrate an examples of the waveforms (portion W1) of the voltage VN2 at the node N2 and the voltage VN3 at the node N3 near the timing t24 illustrated in FIGS. 6A, 6B, 6C, 6D, 6E, 6F, 6G, 6H, 6I, 6J, 6K, and 6L. It is to be noted that, even in a case where the power supply voltage VDDM is fluctuating, it is possible to regard the power supply voltage VDDM as having almost no change in a short period in which the voltages VN2 and VN3 transition. FIGS. 8A and 8B thus illustrate the power supply voltage VDDM as a direct-current voltage. The power supply voltage VDDM is fluctuating and thus may include various voltages. FIG. 8A illustrates the power supply voltage VDDM by using three voltage levels.

Before the transition at the timing t24, the voltage VN2 is clamped by the transistor MP25 to a voltage slightly lower than the power supply voltage VDDM as illustrated in FIGS. 6A, 6B, 6C, 6D, 6E, 6F, 6G, 6H, 6I, 6J, 6K, and 6L. This clamped voltage VN2 becomes higher in a case where the power supply voltage VDDM is high and becomes lower in a case where the power supply voltage VDDM is low as illustrated in FIG. 8A.

Then, in a case where the voltage VN2 is changed from the high level to the low level and the voltage VN2 falls below a voltage (VDDM−|Vth|) that is lower than the power supply voltage VDDM by the absolute value of the threshold voltage Vth of the transistor MP31, the transistor MP31 of the amplification section AMP3 is turned on. In this way, the amplification section AMP3 operates on the basis of the magnitude relationship between the voltage of the node N2 and the threshold voltage Vth of the transistor MP31 as viewed from the power supply node NVDDM. Thus, as illustrated in FIG. 8A, in a case where the power supply voltage VDDM is high, the voltage VN2 is high at which the transistor MP31 is turned on. In a case where the power supply voltage VDDM is low, the voltage VN2 is low at which the transistor MP31 is turned on. This turns on the transistor MP31 at substantially the same timing irrespective of the power supply voltage VDDM. As a result, the amplification section AMP3 changes the voltage VN3 from the low level to the high level at substantially the same timing.

In this way, it is possible for the comparison circuit 24 to reduce the influence of a fluctuation in the power supply voltage VDDM on the transition timing of the voltage VN3. This makes it possible to reduce the influence of the fluctuation in the power supply voltage VDDM on the pixel value VAL.

In this way, the imaging device 1 is provided with the amplification sections AMP1 to AMP3. The amplification section AMP1 is coupled to the power supply node NVDDM and the power supply node NVSSM. The amplification section AMP1 performs a comparison operation on the basis of the signal SIG and the reference signal RAMP. The amplification section AMP1 outputs a signal corresponding to a result of the comparison to the node N1. The amplification section AMP2 includes the transistor MN21 and the load circuit (the transistor MP22, the capacitor C23, the switch SW24, and the transistor MP25). The transistor MN21 includes a gate coupled to the node N1, a drain coupled to the node N2, and a source coupled to the power supply node NVSSM. The load circuit (the transistor MP22, the capacitor C23, the switch SW24, and the transistor MP25) is coupled to the power supply node NVDDM and the node N2. The amplification section AMP3 includes the transistor MP31 and the transistor MN32. The transistor MP31 includes a gate coupled to the node N2, a source coupled to the power supply node NVDDM, and a drain coupled to the node N3. The transistor MN32 applies the power supply voltage VSSL to the node N3 by being turned on. This makes it possible to reduce the influence of fluctuations in the power supply voltages VDDM and VDDL on the transition timing of the voltage VN3 as described above. As a result, it is possible for the imaging device 1 to reduce the influence of fluctuations in the power supply voltages VDDM and VDDL on the pixel value VAL. This makes it possible to increase the image quality of a captured image.

In addition, the imaging device is provided with the transistor MP22, the capacitor C23, the switch SW24, and the transistor MP25. The transistor MP22 includes a source coupled to the power supply node NVDDM, a gate, and a drain coupled to the node N2. The capacitor C23 includes a first terminal coupled to the power supply node NVDDM and a second terminal coupled to the gate of the transistor MP22. The switch SW24 couples the gate of the transistor MP22 and the node N2 by being turned on. The transistor MP25 includes a source coupled to the node N2, a gate coupled to the gate of the transistor MP22, and a drain coupled to the power supply node NVSSM. This makes it possible to reduce the influence of a fluctuation in the power supply voltage VDDM on the transition timing of the voltage VN3 as described above. As a result, it is possible for the imaging device 1 to reduce the influence of a fluctuation in the power supply voltage VDDM on the pixel value VAL. This makes it possible to increase the image quality of a captured image.

[Effects]

As described above, the amplification sections AMP1 to AMP3 are provided in the present embodiment. The amplification section AMP1 is coupled to the power supply node NVDDM and the power supply node NVSSM. The amplification section AMP1 performs a comparison operation on the basis of the signal SIG and the reference signal RAMP. The amplification section AMP1 outputs a signal corresponding to a result of the comparison to the node N1. The amplification section AMP2 includes the transistor MN21 and the load circuit (the transistor MP22, the capacitor C23, the switch SW24, and the transistor MP25). The transistor MN21 includes a gate coupled to the node N1, a drain coupled to the node N2, and a source coupled to the power supply node NVSSM. The load circuit (the transistor MP22, the capacitor C23, the switch SW24, and the transistor MP25) is coupled to the power supply node NVDDM and the node N2. The amplification section AMP3 includes the transistor MP31 and the transistor MN32. The transistor MP31 includes a gate coupled to the node N2, a source coupled to the power supply node NVDDM, and a drain coupled to the node N3. The transistor MN32 applies the power supply voltage VSSL to the node N3 by being turned on. This makes it possible to increase the image quality of a captured image.

In the present embodiment, the transistor MP22, the capacitor C23, the switch SW24, and the transistor MP25 are provided. The transistor MP22 includes a source coupled to the power supply node NVDDM, a gate, and a drain coupled to the node N2. The capacitor C23 includes a first terminal coupled to the power supply node NVDDM and a second terminal coupled to the gate of the transistor MP22. The switch SW24 couples the gate of the transistor MP22 and the node N2 by being turned on. The transistor MP25 includes a source coupled to the node N2, a gate coupled to the gate of the transistor MP22, and a drain coupled to the power supply node NVSSM. This makes it possible to increase the image quality of a captured image.

[Modification Example 1]

In the embodiment described above, the transistor MP25 is provided to clamp the voltage VN2 as illustrated in FIG. 4. There may be, however, additionally provided a circuit to clamp the voltage VN2 more securely like a comparison circuit 24A illustrated in FIG. 9. The comparison circuit 24A includes switches SW19 and SW26. One end of the switch SW19 is coupled to the node N1 and the other end thereof is coupled to the power supply node NVSSM. The switch SW19 includes, for example, a MOS transistor. The switch SW19 is turned on and off on the basis of a control signal SWA. One end of the switch SW26 is coupled to the power supply node NVDDM and the other end thereof is coupled to the node N3. The switch SW26 includes, for example, a MOS transistor. The switch SW26 is turned on and off on the basis of a control signal SWB. These control signals SWA and SWB may each have, for example, a waveform similar to that of the control signal STBT. FIGS. 10A, 10B, 10C, 10D, 10E, 10F, 10G, 10H, 10I, 10J, 10K, and 10L illustrate an operation examples of an imaging device according to the present modification example. The switches SW19 and SW26 are on in the period from the timing t14 to the timing t15. This sets the voltage VN1 of the node N1 to the power supply voltage VSSM (FIG. 10I) and sets the voltage VN2 of the node N2 to the power supply voltage VDDM (FIG. 10J). In this way, the voltage VN2 of the node N2 is set to the power supply voltage VDDM to sufficiently increase the source voltage of the transistor MP25. This turns on the transistor MP25. Thus, in a case where the switch SW26 is turned off at the timing t15, the voltage VN2 of the node N2 is clamped by this transistor MP25 to a voltage slightly lower than the power supply voltage VDDM. The same applies to the period from the timing t20 to the timing t21. This causes the voltage VN2 of the node N2 to be clamped by the transistor MP25 to a voltage slightly lower than the power supply voltage VDDM in a case where the switch SW26 is turned off at the timing t21.

[Modification Example 2]

In the embodiment described above, P-type MOS transistors are included in a differential pair of the amplification section AMP1 as illustrated in FIG. 4, but this is not limitative. Instead, for example, N-type MOS transistors may be included in a differential pair. The following describes a comparison circuit 24B according to the present modification example in detail.

FIG. 11 illustrates a configuration example of the comparison circuit 24B. The comparison circuit 24B includes amplification sections AMP1B to AMP4B.

The amplification section AMP1B includes transistors MN51 to MN53, switches SW54 and SW55, a capacitor C56, transistors MP57 and MP58, and a capacitor C59. The transistors MN51 to MN53 are N-type MOS transistors and the transistors MP57 and MP58 are P-type MOS transistors. These transistors MN51 to MN53, switches SW54 and SW55, capacitor C56, transistors MN57 and MN58, and capacitor C59 respectively correspond to the transistors MP11 to MP13, the switches SW14 and SW15, the capacitor C16, the transistors MN17 and MN18, and the capacitor C19 in the comparison circuit 24 (FIG. 4) according to the embodiment described above.

An amplification section AMP2B includes transistors MP61 and MN62, a capacitor C63, a switch SW64, and a transistor MN65. The transistor MP61 is a P-type MOS transistor and the transistors MN62 and MN65 are N-type MOS transistors. The transistors MP61 and MN62, the capacitor C63, the switch SW64, and the transistor MN65 respectively correspond to the transistors MN21 and MP22, the capacitor C23, the switch SW24, and the transistor MP25 in the comparison circuit 24 (FIG. 4) according to the embodiment described above.

The amplification section AMP3B includes transistors MN71 and MP72. The transistor MN71 is an N-type MOS transistor and the transistor MP72 is a P-type MOS transistor. This amplification section AMP3B is coupled to the power supply nodes NVDDM and NVSSM and operates on the basis of the power supply voltages VDDM and VSSM. The gate of the transistor MN71 is coupled to the node N2, the drain thereof is coupled to the node N3, and the source thereof is coupled to the power supply node NVSSM. The gate of the transistor MP72 is supplied with the control signal STBT, the source thereof is coupled to the power supply node NVDDM, and the drain thereof is coupled to the node N3.

The amplification section AMP4B includes transistors MN81 and MP82. The transistor MN81 is an N-type MOS transistor and the transistor MP82 is a P-type MOS transistor. The transistors MN81 and MP82 respectively correspond to the transistors MP41 and MN42 in the comparison circuit 24 (FIG. 4) according to the embodiment described above.

[Modification Example 3]

In the embodiment described above, the amplification section AMP1 includes a differential pair as illustrated in FIG. 4, but this is not limitative. Alternatively, for example, the amplification section does not have to include any differential pair. The present modification example is described below with reference to some examples.

FIG. 12 illustrates a configuration example of a comparison circuit 24C according to the present modification example. The comparison circuit 24C includes amplification sections AMP1C, AMP2C, AMP3, and AMP4.

The amplification section AMP1C includes transistors MP91 and MN92, a switch SW93, and a transistor MP94. The transistors MP91 and MP94 are P-type MOS transistors and the transistor MN92 is an N-type MOS transistor. The gate of the transistor MP91 is supplied with a bias voltage Vbias3, the source thereof is coupled to the power supply node NVDDM, and the drain thereof is coupled to the node N1. The gate of the transistor MN92 is coupled to the switch SW93 and coupled the other ends of the capacitors 22 and 23, the drain thereof is coupled to the node N1, and the source thereof is coupled to a power supply node NVSS. One end of the switch SW93 is coupled to the gate of the transistor MN92 and coupled to the other ends of the capacitors 22 and 23 and the other end thereof is coupled to the node N1. The switch SW93 includes, for example, a MOS transistor. The switch SW93 is turned on and off on the basis of the control signal AZSW. The gate of the transistor MP94 is supplied with a bias voltage Vbias4, the source thereof is coupled to the power supply node NVSS, and the drain thereof is coupled to the power supply node NVSSM. This amplification section AMP1 is a source-grounded amplifier. The transistor MP91 is a current source. The transistor MP94 operates as a source follower to supply a power supply voltage VSS corresponding to the bias voltage Vbias4 to the power supply node NVSS.

The amplification section AMP2C has a configuration similar to that of the amplification section AMP2 of the comparison circuit 24 (FIG. 4) according to the embodiment described above. The amplification section AMP2C is coupled to the power supply nodes NVDDM and NVSS and operates on the basis of the power supply voltages VDDM and VSS.

Here, the transistor MN92 corresponds to a specific example of the "third transistor" according to the present disclosure. The capacitor 22 corresponds to a specific example of the "second capacitor" according to the present disclosure. The capacitor 23 corresponds to a specific example of the "third capacitor" according to the present disclosure. The switch SW93 corresponds to a specific example of the "third switch" according to the present disclosure. The transistor MP91 corresponds to a specific example of the "second load circuit" according to the present disclosure.

FIG. 13 illustrates a configuration example of another comparison circuit 24D according to the present modification example. The comparison circuit 24D includes amplification sections AMP1D, AMP2D, AMP3D, and AMP4B.

The amplification section AMP1D includes transistors MN101 and MP102, a switch SW103, and a transistor MN104. The transistors MN101 and MN104 are N-type MOS transistors and the transistor MP102 is a P-type MOS transistor. The transistors MN101 and MP102, the switch SW103, and the transistor MN104 respectively correspond to the transistors MP91 and MN92, the switch SW93, and the transistor MP94 in the comparison circuit 24C (FIG. 12). A transistor MP104 operates as a source follower to supply a power supply voltage VDD corresponding to the bias voltage Vbias4 to a power supply node NVDD.

The amplification section AMP2D has a configuration similar to that of the amplification section AMP2B of the comparison circuit 24B (FIG. 11) according to the embodiment described above. The amplification section AMP2D is coupled to the power supply nodes NVDD and NVSSM and operates on the basis of the power supply voltages VDD and VSSM.

The amplification section AMP3D has a configuration similar to that of the amplification section AMP3B of the comparison circuit 24B (FIG. 11) according to the embodiment described above. The amplification section AMP3D is coupled to the power supply nodes NVDD and NVSSM and operates on the basis of the power supply voltages VDD and VSSM.

[Modification Example 4]

In the embodiment described above, the other ends of the capacitors 22 and 23 are both coupled to the gate of the transistor MP12 as illustrated in FIG. 4, but this is not limitative. Instead, for example, the other end of a capacitor C22 and the other end of the capacitor C23 may be coupled to the respective gates of the two transistors included in a differential pair. The present modification example is described below with reference to some examples.

FIG. 14 illustrates a configuration example of another comparison circuit 24E according to the present modification example. The comparison circuit 24E includes amplification sections AMP1E, AMP2, AMP3, and AMP4. The amplification section AMP1E includes the transistors MP11 to MP13, the switches SW14 and SW15, and the transistors MN17 and MN18. The gate of the transistor MP11 is supplied with the bias voltage Vbias1, the source thereof is coupled to the power supply node NVDDM, and the drain thereof is coupled to the sources of the transistors MP12 and MP13. The gate of the transistor MP12 is coupled to the switch SW14 and coupled to the other end of the capacitor 23, the source thereof is coupled to the drain of the transistor MP11 and the source of the transistor MP13, and the drain thereof is coupled to the switch SW14, the drain of the transistor MN17, the gate of the transistor MN17, and the gate of the transistor MN18. The gate of the transistor MP13 is coupled to the switch SW15 and coupled to the other end of the capacitor 22, the source thereof is coupled to the drain of the transistor MP11 and the source of the transistor MP12, and the drain thereof is coupled to the node N1. The one end of the switch SW14 is coupled to the gate of the transistor MP12 and coupled to the other end of the capacitor 23 and the other end thereof is coupled to the drain of the transistor MP12, the drain of the transistor MN17, the gate of the transistor MN17, and the gate of the transistor MN18. The switch SW14 includes, for example, a MOS transistor. The switch SW14 is turned on and off on the basis of the control signal AZSW. The one end of the switch SW15 is coupled to the gate of the transistor MP13 and coupled to the other end of the capacitor 22 and the other end thereof is coupled to the node N1. The switch SW15 includes, for example, a MOS transistor. The switch SW15 is turned on and off on the basis of the control signal AZSW. The gate of the transistor MN17 is coupled to the drain of the transistor MN12, the other end of the switch SW14, the drain of the transistor MN17, and the gate of the transistor MN18, the drain thereof is coupled to the drain of the transistor MP12, the other end of the switch SW14, the gate of the transistor MN17, and the gate of the transistor MN18, and the source thereof is coupled to the power supply node NVSSM. The gate of the transistor MN18 is coupled to the drain of the transistor MP12, the other end of the switch SW14, the drain of the transistor MN17, and the gate of the transistor MN17, the drain thereof is coupled to the node N1, and the source thereof is coupled to the power supply node NVSSM.

FIG. 15 illustrates a configuration example of another comparison circuit 24F according to the present modification example. The comparison circuit 24F includes amplification sections AMP1F, AMP2B, AMP3B, and AMP4B. The amplification section AMP1F includes the transistors MN51 to MN53, the switches SW54 and SW55, and transistors MP57 and MP58. These transistors MN51 to MN53, switches SW54 and SW55, and the transistors MN57 and MN58 respectively correspond to the transistors MP11 to MP13, the switches SW14 and SW15, and the transistors MN17 and MN18 in the comparison circuit 24E (FIG. 14) according to the embodiment described above.

2. Usage Example of Imaging Device

FIG. 16 illustrates a usage example of the imaging device 1 according to the embodiment described above. For example, the imaging device 1 described above is usable in a variety of cases of sensing light such as visible light, infrared light, ultraviolet light, and X-ray as follows.

- Apparatuses that shoot images for viewing such as digital cameras or mobile apparatuses each having a camera function
- Apparatuses for traffic use such as onboard sensors that shoot images of the front, back, surroundings, inside, and so on of an automobile for safe driving such as automatic stop and for recognizing a driver's state, monitoring cameras that monitor traveling vehicles and roads, or distance measurement sensors that measure vehicle-to-vehicle distance
- Apparatuses for use in home electrical appliances such as televisions, refrigerators, or air-conditioners to shoot images of a user's gesture and bring the appliances into operation in accordance with the gesture
- Apparatuses for medical care and health care use such as endoscopes or apparatuses that shoot images of blood vessels by receiving infrared light Apparatuses for security use such as monitoring cameras for crime prevention or cameras for individual authentication Apparatuses for beauty use such as skin measurement apparatuses that shoot images of skin or microscopes that shoot images of scalp Apparatuses for sports use such as action cameras or wearable cameras for sports applications and the like Apparatuses for agricultural use such as cameras for monitoring the conditions of fields and crops

3. Example of Practical Application to Mobile Body

The technology (the present technology) according to the present disclosure is applicable to a variety of products. For example, the technology according to the present disclosure may be achieved as a device mounted on any type of mobile body such as an automobile, an electric vehicle, a hybrid electric vehicle, a motorcycle, a bicycle, a personal mobility, an airplane, a drone, a vessel, or a robot.

FIG. 17 is a block diagram depicting an example of schematic configuration of a vehicle control system as an example of a mobile body control system to which the technology according to an embodiment of the present disclosure can be applied.

The vehicle control system 12000 includes a plurality of electronic control units connected to each other via a communication network 12001. In the example depicted in FIG. 17, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automated driving, which makes the vehicle to travel automatedly without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 17, an audio speaker 12061, a display section 12062, and an instrument panel 12063 are illustrated as the output device. The display section 12062 may, for example, include at least one of an on-board display and a head-up display.

FIG. 18 is a diagram depicting an example of the installation position of the imaging section 12031.

In FIG. 18, the imaging section 12031 includes imaging sections 12101, 12102, 12103, 12104, and 12105.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The imaging section 12105 provided to the upper portion of the windshield within the interior of the vehicle is used mainly to detect a preceding vehicle, a pedestrian, an obstacle, a signal, a traffic sign, a lane, or the like.

Incidentally, FIG. 18 depicts an example of photographing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automated driving that makes the vehicle travel automatedly without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

The example of the vehicle control system to which the technology according to the present disclosure may be applied has been described above. The technology according to the present disclosure may be applied to the imaging section 12031 among the components described above. This makes it possible in the vehicle control system 12000 to increase the image quality of a captured image. As a result, the vehicle control system 12000 allows for an increase in the accuracy of a collision avoidance or collision mitigation function for the vehicle, a following driving function based on vehicle-to-vehicle distance, a vehicle speed maintaining driving function, a warning function of collision of the vehicle, a warning function of deviation of the vehicle from a lane, and the like.

Although the above has described the present technology with reference to the embodiment, modification examples, and a specific practical application example thereof, the present technology is not limited to this embodiment or the like. The present technology may be modified in a variety of ways.

For example, in the embodiment described above, the light-receiving pixels P configured as illustrated in FIG. 2 are used, but this is not limitative. It is possible to use light-receiving pixels having various configurations.

It is to be noted that the effects described in this specification are merely illustrative, but not limited. In addition, other effects may be included.

It is to be noted that the present technology may be configured as follows. The present technology having the following configurations makes it possible to increase the image quality of a captured image.

(1)

An imaging device including:
a light-receiving pixel that generates a pixel signal corresponding to an amount of received light;
a reference signal generator that generates a reference signal whose signal level changes with a lapse of time;
a first amplification section coupled to a first power supply node and a second power supply node, the first amplification section performing a comparison operation on the basis of the pixel signal and the reference signal and outputting a signal corresponding to a result of the comparison to a first node;
a second amplification section including a first transistor and a first load circuit, the first transistor including a gate coupled to the first node, a drain coupled to a second node, and a source coupled to the second power supply node, the first load circuit being coupled to the first power supply node and the second node;
a third amplification section including a second transistor and a first switch, the second transistor including a gate coupled to the second node, a source coupled to the first power supply node, and a drain coupled to a third node, the first switch applying a predetermined voltage to the third node by being turned on; and
a counter coupled to a third power supply node and a fourth power supply node, the counter performing a count operation and stopping the count operation on the basis of a voltage of the third node.

(2)

The imaging device according to (1), in which
the reference signal generator changes the signal level with the lapse of time in a first period,
the first amplification section performs the comparison operation in the first period, and
the first switch is turned on in a second period and the first switch is turned off in the first period, the second period coming before the first period.

(3)

The imaging device according to (1) or (2), in which the first switch couples the third node, and the second power supply node or the fourth power supply node by being turned on.

(4)

The imaging device according to any of (1) to (3), in which an absolute value of a voltage difference between a voltage at the first power supply node and a voltage at the second power supply node is larger than an absolute value of a voltage difference between a voltage at the third power supply node and a voltage at the fourth power supply node.

(5)

The imaging device according to any of (1) to (4), in which the first load circuit includes
a first load transistor including a source coupled to the first power supply node, a gate, and a drain coupled to the second node,
a first capacitor including a first terminal coupled to the first power supply node and a second terminal coupled to the gate of the first load transistor, and
a second switch that couples the gate of the first load transistor and the second node by being turned on.

(6)

The imaging device according to (5), in which the first load circuit includes a second load transistor including a source coupled to the second node, a gate coupled to the gate of the first load transistor, and a drain coupled to the second power supply node.

(7)

The imaging device according to (5) or (6), in which
the reference signal generator changes the signal level with the lapse of time in a first period,
the first amplification section performs the comparison operation in the first period, and
the second switch is turned on in a third period and the second switch is turned off in the first period, the third period coming before the first period.

(8)

The imaging device according to any of (1) to (7), in which the first amplification section includes
a current source coupled to the first power supply node,
a third transistor including a gate, a drain, and a source coupled to the current source,
a fourth transistor including a gate, a drain coupled to the first node, and a source coupled to the current source,
a second capacitor including a first terminal and a second terminal, the first terminal being supplied with the pixel signal, the second terminal being coupled to the gate of the third transistor,
a third capacitor including a first terminal and a second terminal, the first terminal being supplied with the reference signal, the second terminal being coupled to the gate of the third transistor,
a third switch that couples the gate of the third transistor and the drain of the third transistor by being turned on,
a fourth switch that couples the gate of the fourth transistor and the drain of the fourth transistor by being turned on, and
a second load circuit coupled to the second power supply node, the drain of the third transistor, and the drain of the fourth transistor.

(9)

The imaging device according to any of (1) to (7), in which the first amplification section includes
a third transistor including a gate, a drain coupled to the first node, and a source coupled to the second power supply node,
a second capacitor including a first terminal and a second terminal, the first terminal being supplied with the pixel signal, the second terminal being coupled to the gate of the third transistor,
a third capacitor including a first terminal and a second terminal, the first terminal being supplied with the reference signal, the second terminal being coupled to the gate of the third transistor,
a third switch that couples the gate of the third transistor and the drain of the third transistor by being turned on, and a second load circuit coupled to the first power supply node and the first node.

(10)

The imaging device according to any of (1) to (9), in which the second power supply node and the fourth power supply node are coupled to each other.

(11)

An imaging device including:
a light-receiving pixel that generates a pixel signal;
a reference signal generator that generates a reference signal;
a first amplification section coupled to a first power supply node and a second power supply node, the first amplification section performing a comparison operation on the basis of the pixel signal and the reference signal and outputting a signal corresponding to a result of the comparison to a first node;

a second amplification section including a first transistor and a first load circuit, the first transistor including a gate coupled to the first node, a drain coupled to a second node, and a source coupled to the second power supply node, the first load circuit being coupled to the first power supply node and the second node;

a third amplification section including a second transistor and a first switch, the second transistor including a gate coupled to the second node, a source coupled to the first power supply node, and a drain coupled to a third node, the first switch being turned on and off on the basis of a control signal; and a counter coupled to a third power supply node and a fourth power supply node.

(12)

The imaging device according to (11), in which the first amplification section includes a current source coupled to the first power supply node, a third transistor including a gate, a drain, and a source coupled to the current source, a fourth transistor including a gate, a drain coupled to the first node, and a source coupled to the current source, a second capacitor including a first terminal and a second terminal, the first terminal being supplied with the pixel signal, the second terminal being coupled to the gate of the third transistor, a third capacitor including a first terminal and a second terminal, the first terminal being supplied with the reference signal, the second terminal being coupled to the gate of the third transistor, and a second load circuit coupled to the second power supply node, the drain of the third transistor, and the drain of the fourth transistor.

(13)

The imaging device according to (11), in which the first amplification section includes a third transistor including a gate, a drain coupled to the first node, and a source coupled to the second power supply node, a second capacitor including a first terminal and a second terminal, the first terminal being supplied with the pixel signal, the second terminal being coupled to the gate of the third transistor, a third capacitor including a first terminal and a second terminal, the first terminal being supplied with the reference signal, the second terminal being coupled to the gate of the third transistor, and a second load circuit coupled to the first power supply node and the first node.

(14)

An electronic apparatus including:

an imaging device; and a processor that controls an operation of the imaging device, in which the electronic apparatus includes a light-receiving pixel that generates a pixel signal corresponding to an amount of received light, a reference signal generator that generates a reference signal whose signal level changes with a lapse of time, a first amplification section coupled to a first power supply node and a second power supply node, the first amplification section performing a comparison operation on the basis of the pixel signal and the reference signal and outputting a signal corresponding to a result of the comparison to a first node, a second amplification section including a first transistor and a first load circuit, the first transistor including a gate coupled to the first node, a drain coupled to a second node, and a source coupled to the second power supply node, the first load circuit being coupled to the first power supply node and the second node, a third amplification section including a second transistor and a first switch, the second transistor including a gate coupled to the second node, a source coupled to the first power supply node, and a drain coupled to a third node, the first switch applying a predetermined voltage to the third node by being turned on, and a counter coupled to a third power supply node and a fourth power supply node, the counter performing a count operation and stopping the count operation on the basis of a voltage of the third node.

This application claims the priority on the basis of Japanese Patent Application No. 2020-143005 filed on Aug. 26, 2020 with Japan Patent Office, the entire contents of which are incorporated in this application by reference.

It should be understood by those skilled in the art that various modifications, combinations, sub-combinations, and alterations may occur depending on design requirements and other factors insofar as they are within the scope of the appended claims or the equivalents thereof.

The invention claimed is:

1. An imaging device, comprising:
a light-receiving pixel configured to generate a pixel signal that corresponds to an amount of received light;
a reference signal generator configured to:
 generate a reference signal; and
 change a signal level of the reference signal with a lapse of time;
a first amplification section coupled to a first power supply node and a second power supply node, wherein the first amplification section is configured to:
 perform a comparison operation based on the pixel signal and the reference signal; and
 output a specific signal to a first node, wherein the specific signal corresponds to a result of the comparison operation;
a second amplification section that includes a first transistor and a first load circuit, wherein
 the first transistor includes a gate coupled to the first node, a drain coupled to a second node, and a source coupled to the second power supply node, and
 the first load circuit is coupled to the first power supply node and the second node;
a third amplification section includes a second transistor and a first switch, wherein
 the second transistor includes a gate coupled to the second node, a source coupled to the first power supply node, and a drain coupled to a third node, and
 a specific voltage is applied to the third node based on the first switch being turned on; and
a counter coupled to a third power supply node and a fourth power supply node, wherein the counter is configured to:
 perform a count operation; and
 stop the count operation based on a voltage of the third node.

2. The imaging device according to claim 1, wherein
the reference signal generator is further configured to change the signal level with the lapse of time in a first period,
the first amplification section is further configured to perform the comparison operation in the first period, the first switch is turned on in a second period and the first switch is turned off in the first period, and
the second period comes before the first period.

3. The imaging device according to claim 1, wherein the third node is coupled to one of the second power supply node or the fourth power supply node based on the first switch being turned on.

4. The imaging device according to claim 1, wherein an absolute value of a voltage difference between a first voltage at the first power supply node and a second voltage at the second power supply node is larger than an absolute value of a voltage difference between a third voltage at the third power supply node and a fourth voltage at the fourth power supply node.

5. The imaging device according to claim 1, wherein the first load circuit includes:
   a first load transistor that includes a source coupled to the first power supply node, a gate, and a drain coupled to the second node,
   a first capacitor that includes a first terminal coupled to the first power supply node and a second terminal coupled to the gate of the first load transistor, and
   a second switch, wherein the gate of the first load transistor is coupled to the second node based on the second switch being turned on.

6. The imaging device according to claim 5, wherein
   the first load circuit includes a second load transistor, and
   the second load transistor includes a source coupled to the second node, a gate coupled to the gate of the first load transistor, and a drain coupled to the second power supply node.

7. The imaging device according to claim 5, wherein
   the reference signal generator is configured to change the signal level with the lapse of time in a first period,
   the first amplification section is further configured to perform the comparison operation in the first period,
   the second switch is turned on in a third period and the second switch is turned off in the first period, and
   the third period comes before the first period.

8. The imaging device according to claim 1, wherein the first amplification section includes:
   a current source coupled to the first power supply node,
   a third transistor that includes a gate, a drain, and a source coupled to the current source,
   a fourth transistor that includes a gate, a drain coupled to the first node, and a source coupled to the current source,
   a second capacitor that includes a first terminal and a second terminal, wherein
     the first terminal is supplied with the pixel signal, and
     the second terminal is coupled to the gate of the third transistor,
   a third capacitor that includes a third terminal and a fourth terminal, wherein
     the third terminal is supplied with the reference signal, and
     the fourth terminal is coupled to the gate of the third transistor,
   a third switch, wherein the gate of the third transistor is coupled to the the drain of the third transistor based on the third switch being turned on,
   a fourth switch, wherein the gate of the fourth transistor is coupled to the drain of the fourth transistor based on the fourth switch being turned on, and
   a second load circuit coupled to the second power supply node, the drain of the third transistor, and the drain of the fourth transistor.

9. The imaging device according to claim 1, wherein the first amplification section includes:
   a third transistor that includes a gate, a drain coupled to the first node, and a source coupled to the second power supply node,
   a second capacitor that includes a first terminal and a second terminal, wherein
     the first terminal is supplied with the pixel signal, and
     the second terminal is coupled to the gate of the third transistor,
   a third capacitor that includes a third terminal and a fourth terminal, wherein
     the third terminal is supplied with the reference signal, and
     the fourth terminal is coupled to the gate of the third transistor,
   a third switch, wherein the gate of the third transistor is coupled to the drain of the third transistor based on the third switch being turned on, and
   a second load circuit coupled to the first power supply node and the first node.

10. The imaging device according to claim 1, wherein the second power supply node is coupled the fourth power supply node.

11. An imaging device, comprising:
   a light-receiving pixel configured to generate a pixel signal;
   a reference signal generator configured to generate a reference signal;
   a first amplification section coupled to a first power supply node and a second power supply node, wherein the first amplification section is configured to:
     perform a comparison operation based on the pixel signal and the reference signal; and
     output a specific signal to a first node, wherein the specific signal corresponds to a result of the comparison operation;
   a second amplification section that includes a first transistor and a first load circuit, wherein
     the first transistor includes a gate coupled to the first node, a drain coupled to a second node, and a source coupled to the second power supply node, and
     the first load circuit is coupled to the first power supply node and the second node;
   a third amplification section includes a second transistor and a first switch, wherein
     the second transistor includes a gate coupled to the second node, a source coupled to the first power supply node, and a drain coupled to a third node, and
     the first switch is turned one of on or off based on a control signal; and
   a counter coupled to a third power supply node and a fourth power supply node.

12. The imaging device according to claim 11, wherein the first amplification section includes:
   a current source coupled to the first power supply node,
   a third transistor that includes a gate, a drain, and a source coupled to the current source,
   a fourth transistor that includes a gate, a drain coupled to the first node, and a source coupled to the current source,
   a second capacitor that includes a first terminal and a second terminal, wherein
     the first terminal is supplied with the pixel signal, and
     the second terminal is coupled to the gate of the third transistor, a third capacitor includes a third terminal and a fourth terminal, wherein
the third terminal is supplied with the reference signal, and
the fourth terminal is coupled to the gate of the third transistor, and
a second load circuit coupled to the second power supply node, the drain of the third transistor, and the drain of the fourth transistor.

13. The imaging device according to claim 11, wherein the first amplification section includes:
a third transistor including a gate, a drain coupled to the first node, and a source coupled to the second power supply node,
a second capacitor includes a first terminal and a second terminal, wherein
the first terminal is supplied with the pixel signal, and
the second terminal is coupled to the gate of the third transistor,
a third capacitor includes a third terminal and a fourth terminal, wherein
the third terminal is supplied with the reference signal, and
the fourth terminal is coupled to the gate of the third transistor, and
a second load circuit coupled to the first power supply node and the first node.

14. An electronic apparatus, comprising:
an imaging device; and
a processor configured to control an operation of the imaging device, wherein the electronic apparatus includes:
a light-receiving pixel configured to generate a pixel signal that corresponds to an amount of received light,
a reference signal generator configured to:
generate a reference signal; and
change a signal level of the reference signal with a lapse of time,
a first amplification section coupled to a first power supply node and a second power supply node, wherein the first amplification is section is configured to:
perform a comparison operation based on the pixel signal and the reference signal; and
output a specific signal to a first node, wherein the specific signal corresponds to a result of the comparison operation,
a second amplification section that includes a first transistor and a first load circuit, wherein
the first transistor includes a gate coupled to the first node, a drain coupled to a second node, and a source coupled to the second power supply node, and
the first load circuit is coupled to the first power supply node and the second node,
a third amplification section that includes a second transistor and a first switch, wherein
the second transistor includes a gate coupled to the second node, a source coupled to the first power supply node, and a drain coupled to a third node, and
a specific voltage is applied to the third node based on the first switch being turned on, and
a counter coupled to a third power supply node and a fourth power supply node, wherein the counter is configured to:
perform a count operation; and
stop the count operation based on a voltage of the third node.

* * * * *